(12) United States Patent
Pierquet et al.

(10) Patent No.: US 12,126,264 B1
(45) Date of Patent: Oct. 22, 2024

(54) CURRENT SENSORS FOR POWER CONVERTERS

(71) Applicants: Brandon Pierquet, San Francisco, CA (US); Ashish K. Sahoo, San Jose, CA (US); Garet E. Gamache, San Francisco, CA (US); Jie Lu, Sunnyvale, CA (US)

(72) Inventors: Brandon Pierquet, San Francisco, CA (US); Ashish K. Sahoo, San Jose, CA (US); Garet E. Gamache, San Francisco, CA (US); Jie Lu, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 855 days.

(21) Appl. No.: 16/720,749

(22) Filed: Dec. 19, 2019

Related U.S. Application Data

(60) Provisional application No. 62/785,776, filed on Dec. 28, 2018.

(51) Int. Cl.
  *H02M 3/24* (2006.01)
  *G01R 15/18* (2006.01)
  *H01F 27/28* (2006.01)
  *H03K 5/24* (2006.01)
  *H05K 1/02* (2006.01)
  *H02M 1/00* (2006.01)

(52) U.S. Cl.
  CPC ............ *H02M 3/24* (2013.01); *G01R 15/181* (2013.01); *H01F 27/2804* (2013.01); *H03K 5/24* (2013.01); *H05K 1/0298* (2013.01); *H01F 2027/2809* (2013.01); *H02M 1/0009* (2021.05); *H05K 2201/09227* (2013.01)

(58) Field of Classification Search
  CPC ...... H02M 3/24; H02M 1/0009; G01R 15/181
  See application file for complete search history.

(56) References Cited

U.S. PATENT DOCUMENTS

| | | | |
|---|---|---|---|
| 10,110,177 B1* | 10/2018 | Koroglu | H03F 3/21 |
| 2011/0032683 A1* | 2/2011 | Li | H02M 3/33592 |
| | | | 361/760 |
| 2014/0266434 A1* | 9/2014 | Kireev | H01L 28/10 |
| | | | 336/200 |
| 2017/0016937 A1* | 1/2017 | Riehl | H01F 38/14 |
| 2017/0316872 A1* | 11/2017 | Kneller | H02M 5/18 |

OTHER PUBLICATIONS

Slawomir Tumanski 2007 Meas. Sci. Technol. 18 R31-R46 (Year: 2007).*

(Continued)

*Primary Examiner* — Jue Zhang
*Assistant Examiner* — Afework S Demisse
(74) *Attorney, Agent, or Firm* — Young Basile Hanlon & MacFarlane, P.C.

(57) ABSTRACT

Systems and methods for current sensing are described. For example, a system may include a transformer including a winding that connects a first tap and a second tap; a circuit board; a first trace on a layer of the circuit board, wherein the first trace connects the first tap to a rectifier; a coil including one or more turns of trace on the layer of the circuit board, adjacent to the first trace; and a measurement circuit configured to estimate current flowing in the first trace based on voltage across the coil.

20 Claims, 18 Drawing Sheets

(56) References Cited

OTHER PUBLICATIONS

Wang, K., et al., "A High-Bandwidth Integrated Current Measurement for Detecting Switching Current of Fast GaN Devices", IEEE Transactions on Power Electronics (vol. 33, Issue 7), Jul. 2018, pp. 6199-6210 (12 pp).
Ramaswamy, B., et al., "Wireless Current Sensing by Near Field Induction From a Spin Transfer Forque Nano-Oscillator", Applied Physics Letters 108, 242403 (2016); doi: 10.1063/1.4963621, http://dx.doi.org/10.1063/1.4953621 (13 pp).
Electronics Tutorials, "Current Transformer Basics and the Current Transformer", https://www.electronics-tutorials.ws/transformer/current-transformer.html, Home/Transformer/TheCurrent-Transformer, Downloaded Aug. 2018 (9 pp).
Wikipedia, "Current Sensing Techniques", https://en.wikipedia.org/wiki/Current_sensing_techniques, Downloaded Aug. 2018 (6 pp).
Tumanski, S., "Induction Coil Sensors—A Review", Institute of Physics Publishing, Measurement of Science and Technology 18 (2007) R31-R46 (16 pp).
Wikipedia, "Rogowski coil", https://en.wikipedia.org/wiki/Rogowski_coil, Downloaded Aug. 2018 (4 pp).

\* cited by examiner

CURRENT SENSORS FOR POWER CONVERTERS

CROSS-REFERENCE TO RELATED APPLICATION(S)

This application claims the benefit of U.S. Provisional Application No. 62/785,776, filed on Dec. 28, 2018. The content of the foregoing application is incorporated herein by reference in its entirety for all purposes.

TECHNICAL FIELD

This disclosure relates to current sensors for power converters.

BACKGROUND

Power converters are used to transfer power between circuits operating at different voltage levels. For example, power converters may be employed at terminals of high voltage power transmission lines. For example, power converters may be employed in power supplies for computing server racks. Power converters may include components or devices that are only rated to operate well or safely in a particular range of voltages and/or currents. Current sensors may be used in power converters to detect fault conditions and/or to provide feedback for control of a power converter. Examples of current sensors that may be used to measure currents in a power converter include a current transformer, a current shunt with an isolation amplifier, or a Hall Effect integrated circuit.

SUMMARY

Disclosed herein are implementations of current sensors for power converters.

In a first aspect, the subject matter described in this specification can be embodied in systems that include a transformer including a winding that connects a first tap and a second tap; a circuit board; a first trace on a layer of the circuit board, wherein the first trace connects the first tap to a rectifier; a coil including one or more turns of trace on the layer of the circuit board, adjacent to the first trace; and a measurement circuit configured to estimate current flowing in the first trace based on of voltage across the coil.

In a second aspect, the subject matter described in this specification can be embodied in systems that include a circuit board; a first trace on a layer of the circuit board; a coil including one or more turns of trace on the layer of the circuit board, adjacent to the first trace; and a measurement circuit, configured to estimate current flowing in the first trace based on voltage across the coil.

In a third aspect, the subject matter described in this specification can be embodied in systems that include a transformer including a winding that connects a first tap and a second tap; a circuit board; a first trace on a layer of the circuit board, wherein the first trace connects to the first tap to a rectifier; a coil including one or more turns of trace on the layer of the circuit board, positioned to inductively couple to the first trace; and a measurement circuit, configured to estimate current flowing in the first trace based on voltage across the coil.

In a fourth aspect, the subject matter described in this specification can be embodied in systems that include a transformer including a secondary winding that connects a first tap and a second tap; a first length of conductor that connects the first tap to a rectifier; a coil including two or more turns of conductor in a spiral arrangement that is coplanar with the first length of conductor, and adjacent to the first length of conductor; and a measurement circuit configured to estimate current flowing in the first length of conductor based on voltage across the coil.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
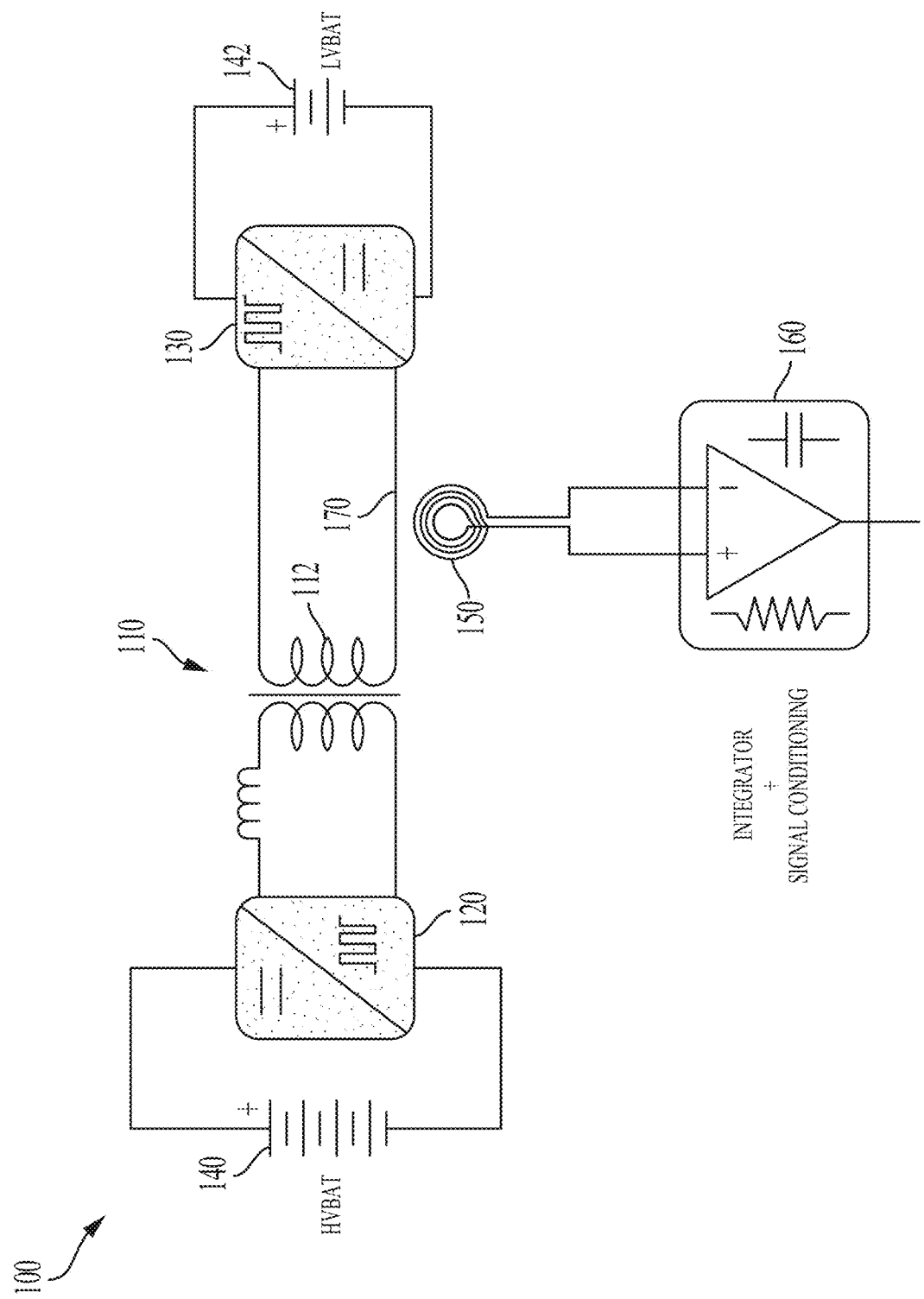
FIG. 1 is a circuit diagram of an example of a system including a high voltage to low voltage DC/DC converter with a current sensor.

Described herein are systems, circuits, and methods that may be used to measure current in power converters. In isolated power converters, measurement of the high-frequency transformer current can be used for high-speed fault management and feedback for high-bandwidth controls. As switching frequencies of power converters are being pushed greater than 1 MHz (e.g., facilitated by the use of GaN switches), conventional isolated current sensors may fail to address this need. A current sensor for fault detection that is fast (e.g., <1 ns), high bandwidth (e.g., >10 MHz), isolated, compact, have a capability to sense a wide range of current (e.g., including currents greater than 200 A) is desirable. It is noted that in some power converters, current sensing is preferred on the low voltage side because the low voltage side may be susceptible to transformer saturation in absence of blocking capacitor, and higher current (e.g., ~200 Amperes) on the low voltage side may enable better resolution of current measurements.

A time varying current through a conductor induces a magnetic field. If a coil is placed near this varying magnetic field, a voltage is induced, according to Faradays law. This voltage can be integrated to result in a parameter (e.g., a voltage) proportionate to current flowing in the conductor. For example, a printed circuit board (PCB) embedded current sensor may be used to sense current in a power converter. One or more PCB embedded coils may be built near transformer current planes, and these PCB embedded coils would be induced with a voltage due to the varying magnetic fields. A measurement circuit with a proper filter signal conditioner may be connected to the one or more PCB embedded coils to extract the current flowing through the transformer. A current sensors using one or more PCB embedded coils and a measurement circuit may offer advantages, such as, being isolated since it does not make any contact with the high current terminals; low cost for coil as it may be constructed of traces embedded in the PCB; high-speed and high bandwidth; low or negligible delay; and/or minimal analog circuitry required (e.g., an integrator circuit and some filtering). The overall sensor cost may be favorable compared with previous solutions.

The current sensors described herein may provide advantages over some conventional current sensing techniques. For example, a current transformer may not be able to handle high current measurements (e.g., >20 Amperes), which means the current transformer may only be available for use on the high voltage side of a DC/DC converter, and available parts may not meet hipot rating and creep age requirements. The bandwidth of a current transformer may be substantially lower than the disclosed current sensors. For example, a current transformer may be limited to an approximately 500 kHz bandwidth, while the some of the disclosed current sensors may support bandwidths greater than 10 MHz. A current transformer may also have additional large components that result in higher cost and volume and/or lower reliability than some of the disclosed current sensors.

For example, a current shunt with operational amplifier includes a resistor in the power converter circuit that may generate significant loss in efficiency of the power converter. The bandwidth of the current shunt sensor may be significantly limited by the isolation amplifier relative to some of the disclosed current sensors. Greater delay may be introduced by the isolation amplifier relative to some of the disclosed current sensors. The isolation amplifier has to be powered with an isolated power supply, which may consume more power and/or take up more space than some of the disclosed current sensors. A current shunt with operational amplifier may also have additional large components that result in higher cost and volume and/or lower reliability than some of the disclosed current sensors.

For example, a Hall Effect integrated circuit may substantially lower bandwidth (e.g., typical off-the shelf Hall Effect integrated circuits have bandwidth on the order of 100 kHz) than some of the disclosed current sensors. Greater delay may be introduced by the isolation stage used with a Hall Effect integrated circuit relative to some of the disclosed current sensors. Some of the disclosed current sensors may have greater accuracy over temperature and lifetime than a current sensor using a Hall Effect integrated circuit. Some of the disclosed current sensors may have more linearity than a current sensor using a Hall Effect integrated circuit. A Hall Effect integrated circuit based current sensor may also have additional large components that result in higher cost and volume and/or lower reliability than some of the disclosed current sensors.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures.

FIG. 1 is a circuit diagram of an example of a system 100 including a high voltage to low voltage DC/DC converter with a current sensor. The system 100 includes a power converter; including a transformer 110, an inverter 120, and a rectifier 130; which transfer power between a high voltage battery 140 (e.g., a 400-volt or an 800-volt battery) and a low voltage battery 142 (e.g., a 12-volt or a 48-volt battery). The high voltage battery 140 is connected to terminals of the inverter 120 and the low voltage battery 142 is connected to terminals of the rectifier 130. The system also includes a current sensor, including a coil 150 connected to a measurement circuit 160 and positioned for measuring current flowing between the transformer 110 and the rectifier 130. The current sensor may be used for measurement of the high-frequency currents through the transformer 110 that can be used for high-speed fault management and feedback for high-bandwidth controls.

The system 100 includes a transformer 110 that couples power from an inverter 120 to a rectifier 130. The transformer includes a winding 112 (e.g., a secondary winding) that connects a first tap and a second tap.

The system 100 includes a first length of conductor 170 that connects the first tap to the rectifier 130. Alternating current from the transformer 110 may flow through the first length of conductor 170. For example, the first length of conductor 170 may include a wire (e.g., 18 gauge copper wire), which may be wrapped in insulation. In some implementations, the system includes a circuit board (e.g., a PCB) and the first length of conductor 170 is a first trace on a layer of the circuit board, wherein the first trace connects the first tap to the rectifier 130. For example, the layer of the circuit board may be a conductive layer (e.g., a copper layer) of a circuit board (e.g., a printed circuit board (PCB)) that includes a stack of substrate layers, which may be laminated together to form the circuit board.

The system 100 includes a coil 150 including two or more turns of conductor in a spiral arrangement that is coplanar with the first length of conductor 170, and adjacent to the first length of conductor 170. The coil 150 is adjacent to the first length of conductor 170 in the sense that there are no conductors positioned in the space directly between the coil 150 and the first length of conductor 170. For example, the coil 150 may include wire formed into a spiral that is positioned (e.g., by soldering or another fastening structure) to be coplanar with the first length of conductor 170. In some implementations, the system includes a circuit board (e.g., a PCB) and the coil 150 includes one or more turns of trace on the layer of the circuit board, adjacent to the first trace. The coil 150 is adjacent to the first trace in the sense that there are no conductors positioned in the space directly between the coil 150 and the first trace.

For example, the coil 150 (e.g., including one or more turns of trace on the layer of a circuit board and/or two or more turns of conductor in a spiral arrangement that is coplanar with the first length of conductor 170) may be positioned to inductively couple to the first length of conductor 170 (e.g., the first trace). In some implementations, an edge of the coil 150 is within one millimeter of an edge of the first length of conductor 170 (e.g., the first trace).

The system 100 includes a measurement circuit 160 configured to estimate current flowing in the first length of conductor 170 based on voltage across the coil 150. For example, the measurement circuit 160 may include an integrator circuit that is configured to estimate current flowing in the first length of conductor 170 based on integration over time of voltage across the coil 150. A time varying current through the first length of conductor 170 induces a magnetic field. According to Faradays Law, this varying magnetic field induces a voltage in the coil 150. This voltage across the coil 150 can be integrated to result in a parameter (e.g., a voltage) proportionate to current flowing in the first length of conductor 170 (e.g., the first trace). In some implementations, the measurement circuit 160 may be connected to a series of coils positioned near the current flowing in the first length of conductor 170 and the voltages across the series of coils may be integrated to estimate this current. For example, a series of coils may be arranged as depicted in FIG. 3, FIG. 4, FIG. 6, FIG. 7, and/or FIG. 8. For example, the measurement circuit 160 may include a resistor-capacitor network (an RC network) that integrates the voltages by storing charge on one or more capacitors. In some implementations, the measurement circuit 160 includes components for signal conditioning that converts a parameter (e.g., a voltage) proportional to the current flowing in the first length of conductor 170 to a format that may be readily read or utilized by another circuitry, such as, a processor or microcontroller that controls the inverter 120 and/or the rectifier 130 or a transformer protection circuit that is configured to protect the transformer 110 in the event of a fault condition. For example, the measurement circuit 160 may include an operational amplifier with additional components configured to amplify the result of an integration of voltage across the coil 150 into a useful format or range. For example, the measurement circuit 160 may be implemented as described in relation to FIG. 10.

The rectifier 130 may be suitable to be interfaced with the low voltage battery 142 and be able to provide high efficiency while meeting desired specifications. Switching control may be formulated for operation of a topology of the inverter 120 and the rectifier 130 to attain zero voltage switching over an entire battery range. For example, a processor (e.g., a microprocessor or a microcontroller) may be used to implement switching control for the system 100. Zero voltage switching enables use of switching frequency in the MHz range and may reduce the size of magnetic components. This may result in obtaining high power density, which converts to savings in volume and weight of the system 100.

For example, for high voltage batteries (e.g., an 800-volt battery), newer multilevel topologies may be used to exploit the benefits of latest wide band-gap GaN technology. The inverter 120 may be suitable to be interfaced with the high voltage battery 140 and be able to provide high efficiency while meeting desired specifications. In some implementations, switching control may be formulated to achieve active voltage balancing of split capacitors in the inverter 120. For example, the inverter 120 may include a three-level stacked half-bridge topology. For example, techniques described herein may be implemented for power converters fabricated with other technologies, such as Si technology. For example, techniques described herein may be implemented for power converters connected to various types of batteries with various voltage levels.

The converters of the system 100 may be bidirectional in the sense that power may be transferred from the high voltage battery 140 to the low voltage battery 142 at one time as well as from the low voltage battery 142 to the high voltage battery 140 at another time. The bidirectional nature of the inverter 120 and the rectifier 130 may facilitate the use of system 100 in applications of high voltage to low voltage DC/DC converters, and high voltage chargers.

In the example of FIG. 1, the first length of conductor 170 that bears the measured current connects the winding 112 of the transformer 110 to the rectifier 130. In some implementations (not shown in FIG. 1), the current sensor, including the coil 150, may be positioned to measure current in a length of conductor (e.g., a trace on a circuit board) that connects a winding (e.g., a primary winding) of the transformer 110 to the inverter 120.

Figure 2:
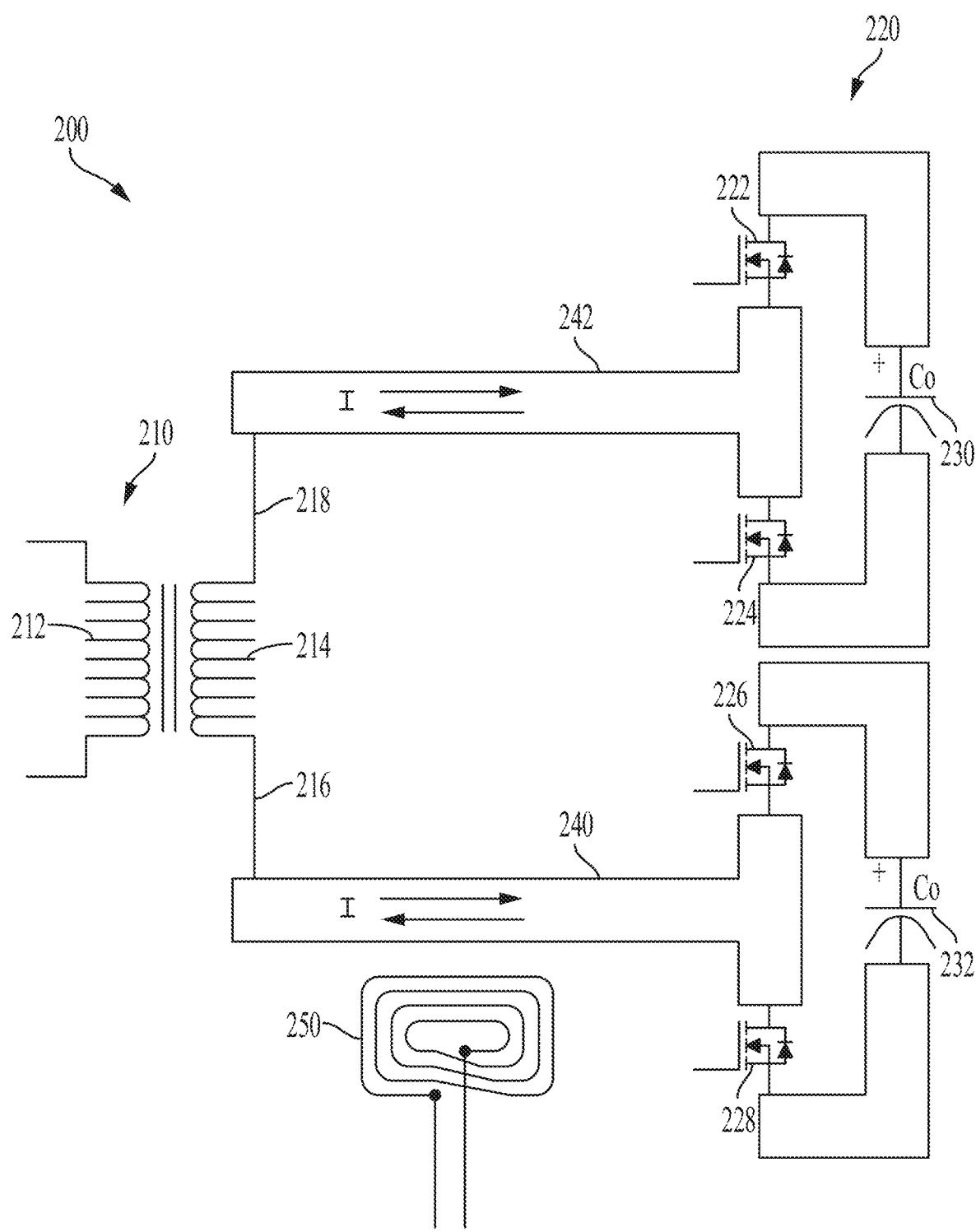
FIG. 2 is a circuit diagram of an example of a system including a power converter with a coil for sensing current.

FIG. 2 is a circuit diagram of an example of a system 200 including a power converter with a coil for sensing current. In this example, a one-coil solution is positioned near a trace connected to a transformer, which may be used for transformer current measurement. The system 200 includes a transformer 210 and a rectifier 220. The rectifier 220 may be implemented on a circuit board (e.g., a PCB). The system 200 includes a first trace 240 on a layer of the circuit board that connects the transformer 210 to the rectifier 220. The system 200 includes a second trace 242 on the layer of the circuit board that connects the transformer 210 to the rectifier 220. The system 200 includes a coil 250 including one or more turns of trace on the layer of the circuit board, adjacent to the first trace 240. The coil 250 may be used with a measurement circuit (e.g., the measurement circuit 160) (not shown in FIG. 2) to measure a current flowing through the first trace 240.

The transformer 210 includes a primary winding 212 and a secondary winding 214. The secondary winding 214 connects a first tap 216 and a second tap 218 of the transformer 210.

The rectifier 220 includes a first switch 222, a second switch 224, and a first capacitor 230 in a full-bridge topology. The rectifier 220 includes a first switch 226, a second switch 228, and a second capacitor 232 in a full-bridge topology. Although not explicitly shown in FIG. 2, a load (e.g., the low voltage battery 142) may be connected across output terminals of the rectifier 220. For example, the first capacitor 230 and the second capacitor 232 may be connected in parallel between the output terminals of the rectifier 220.

The system 200 includes a first trace 240 on a layer of the circuit board. The first trace 240 connects to the first tap 216 to the rectifier 220. The system 200 includes a second trace 242 on the layer of the circuit board. The second trace 242 connects to the second tap 218 to the rectifier 220. For example, the second trace 242 may be connected in series with the first trace 240, such that the same current flows through the first trace 240 and the second trace 242. For example, the first trace 240 and the second trace 242 may be copper traces on a PCB.

The system 200 includes a coil 250 including one or more turns of trace on the layer of the circuit board, adjacent to the first trace 240. The coil 250 may be positioned to inductively couple to the first trace 240. For example, an edge of the coil 250 may be within one millimeter of an edge of the first trace 240. In some implementations, the coil 250 includes two or more turns (e.g., four turns) arranged in a spiral. Terminals of the coil 250 may be connected to a measurement circuit (e.g., the measurement circuit 160) (not shown in FIG. 2) to measure a current flowing through the first trace 240. For example, an output (e.g., a voltage) of the measurement circuit may be proportional to a current (I) flowing in the first trace 240 in a format that may be read and/or utilized by other circuitry, such as, a processor or microcontroller that controls an inverter and/or the rectifier 220 or a transformer protection circuit that is configured to protect the transformer 210 in the event of a fault condition.

Figure 3:
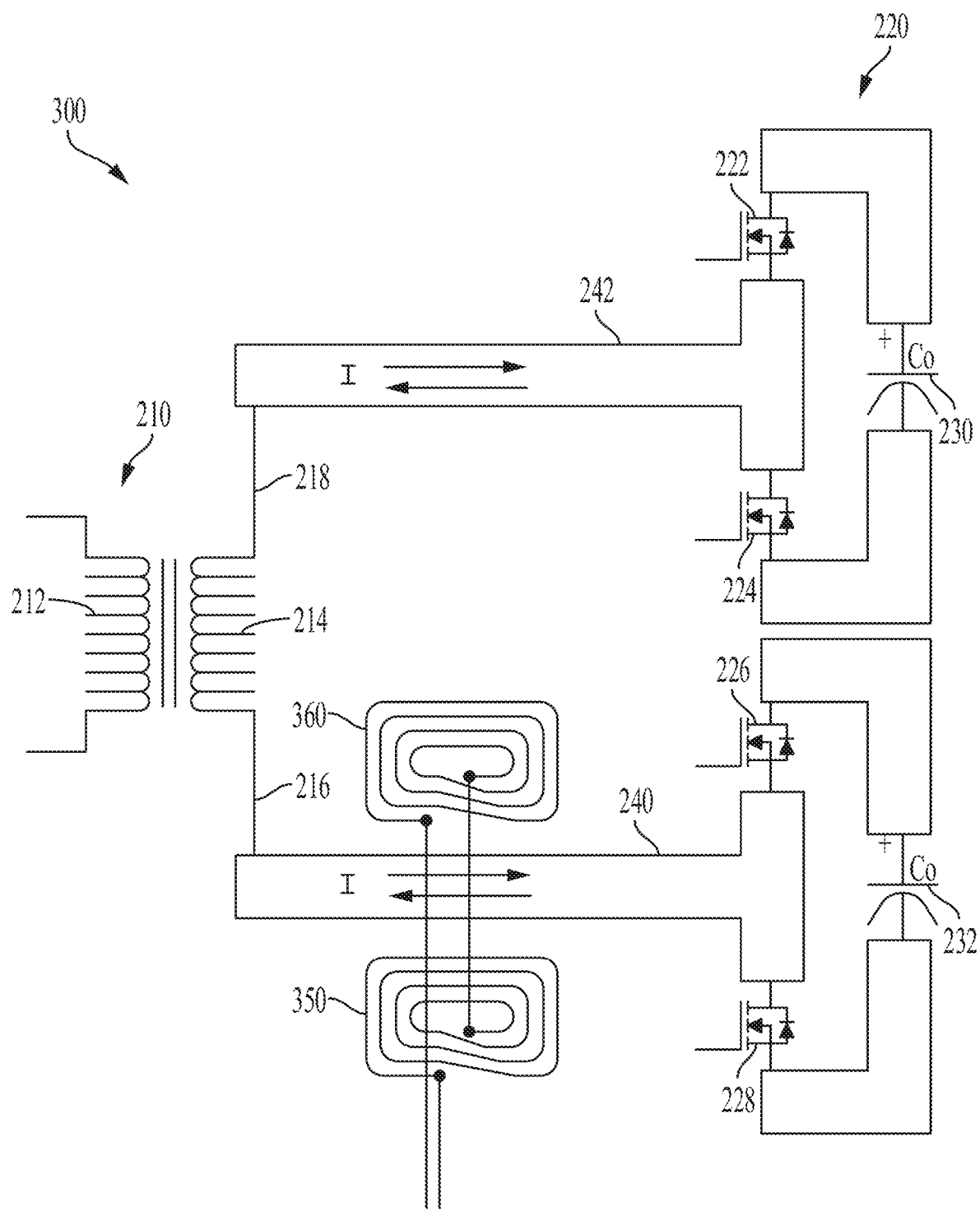
FIG. 3 is a circuit diagram of an example of a system including a power converter with a pair of coils in series for sensing current.

In some implementations (e.g., as shown in FIGS. 2-3), multiple coils may be connected in series to capture more flux and induce more voltage. Another motivation to use multiple coils is for canceling stray flux. In some implementations, the primary side of system 200 includes a high voltage power source exceeding 110V, 240V, 277V, 400V, 800V, and so forth. In some implementations, the secondary side of system 200 produces an out of relatively lower voltage, such as 48V, 24V, 20V, 12V, 9V, 5V, and so forth.

FIG. 3 is a circuit diagram of an example of a system 300 including a power converter with a pair of coils (350 and 360) in series for sensing current. Dual coils may be positioned near a trace connected to a tap of the transformer 210. The two coils may be in anti-winding direction (e.g., if one is wound clockwise, the other should be wound anti-clockwise to induce voltage in same direction). The system 300 includes the transformer 210 and a rectifier 220 of FIG. 2, connected by the first trace 240 and the second trace 242. The system 300 includes a first coil 350 including one or more turns of trace on the layer of the circuit board, adjacent to the first trace 240. The system 300 includes a second coil 360 including one or more turns of trace on the layer of the circuit board, adjacent to the first trace 240, on an opposite side of the first trace 240 from the first coil 350. The second coil 360 is connected in series with the first coil 350 between terminals of a measurement circuit (e.g., the measurement circuit 160) (not shown in FIG. 3).

The system 300 includes a first coil 350 including one or more turns of trace on the layer of the circuit board, adjacent to the first trace 240. The first coil 350 may be positioned to inductively couple to the first trace 240. For example, an edge of the first coil 350 may be within one millimeter of an edge of the first trace 240. In some implementations, the first coil 350 includes two or more turns (e.g., four turns) arranged in a spiral.

The system 300 includes a second coil 360 including one or more turns of trace on the layer of the circuit board, adjacent to the first trace 240, on an opposite side of the first trace 240 from the first coil 350. For example, the second coil 360 may be positioned to inductively couple to the first trace 240. For example, the first coil 350 and the second coil 360 may have opposite winding directions.

The second coil 360 is connected in series with the first coil 350 between terminals of a measurement circuit (e.g., the measurement circuit 160) (not shown in FIG. 2) to measure a current flowing through the first trace 240. For example, an output (e.g., a voltage) of the measurement circuit may be proportional to a current (I) flowing in the first trace 240 in a format that may be read and/or utilized by other circuitry, such as, a processor or microcontroller that controls an inverter and/or the rectifier 220 or a transformer protection circuit that is configured to protect the transformer 210 in the event of a fault condition.

In some implementations (not shown in FIG. 3), a pair of coils may be positioned coplanar with a first length of conductor (e.g., a wire or a trace) bearing current from the transformer 210 and on opposite sides of the first length of conductor. Thus, the pair of coils do not necessarily need to be implemented on a circuit board with traces. Such a system may include a first coil including two or more turns of conductor in a spiral arrangement that is coplanar with the first length of conductor, and adjacent to the first length of conductor. This system may include a second coil including two or more turns of conductor in a spiral arrangement that is coplanar with the first length of conductor, adjacent to the first length of conductor, on an opposite side of the first length of conductor from the first coil. The second coil may be connected in series with the first coil between terminals of a measurement circuit (e.g., the measurement circuit 160).

Figure 4:
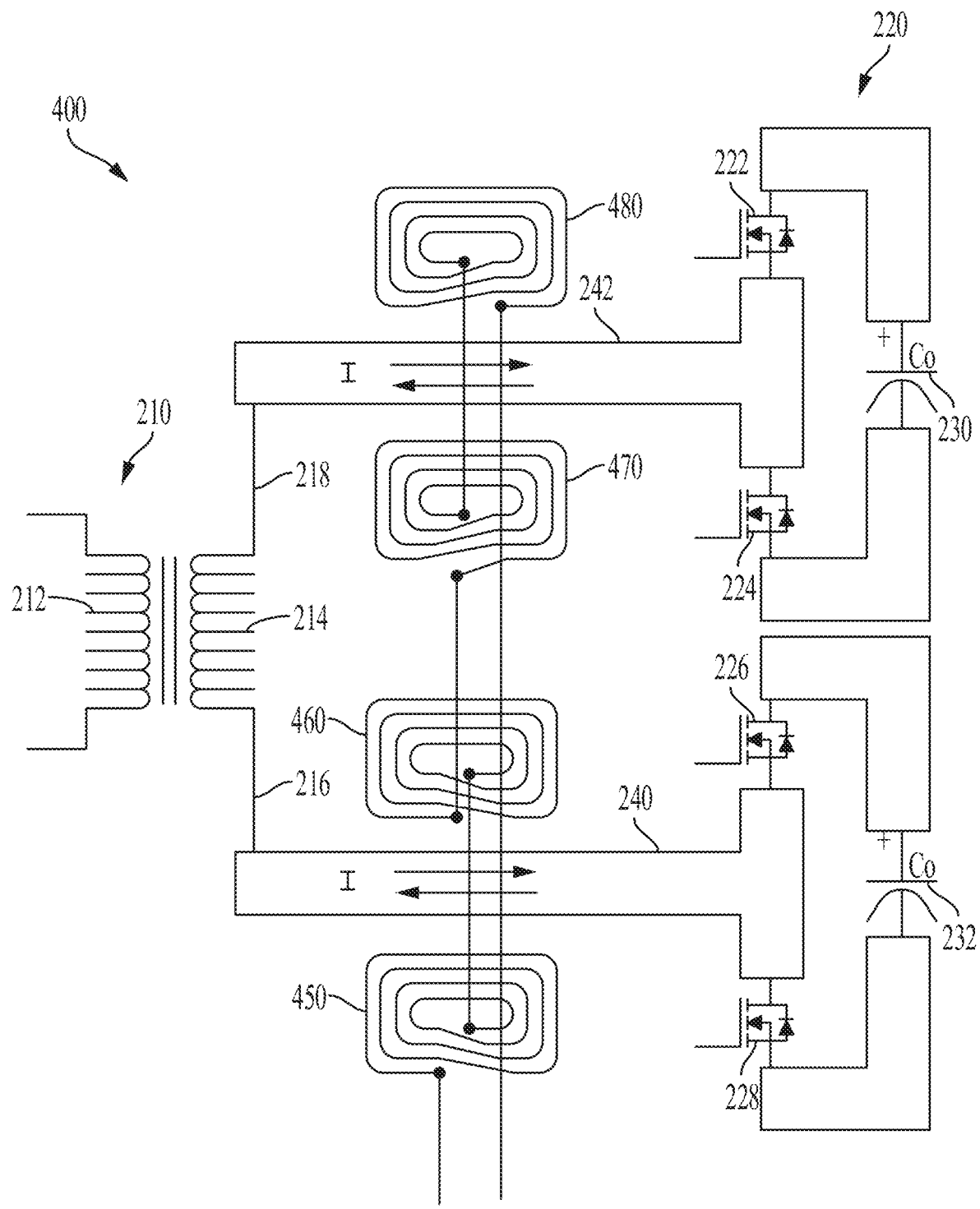
FIG. 4 is a circuit diagram of an example of a system including a power converter with multiple coils in series for sensing current.

FIG. 4 is a circuit diagram of an example of a system 400 including a power converter with multiple coils in series for sensing current. In this example, four coils are positioned on both sides of two traces respectively connected to two taps of the transformer 210 that both bear a current through a winding of the transformer 210. Alternate coils may be wound 180 degrees out of phase. The system 400 includes the transformer 210 and a rectifier 220 of FIG. 2, connected by the first trace 240 and the second trace 242. The system 400 includes a first coil 450 including one or more turns of trace on the layer of the circuit board, adjacent to the first trace 240. The system 400 includes a second coil 470 including one or more turns of trace on the layer of the circuit board, adjacent to the second trace 242. The system 400 includes a third coil 460 including one or more turns of trace on the layer of the circuit board, adjacent to the first trace 240, on an opposite side of the first trace 240 from the first coil 450. The system 400 includes a fourth coil 480 including one or more turns of trace on the layer of the circuit board, adjacent to the second trace 242, on an opposite side of the second trace 242 from the second coil 470. The second coil 470 is connected in series with the first coil 450 between terminals of a measurement circuit (e.g., the measurement circuit 160) (not shown in FIG. 4). The fourth coil 480 is connected in series with the third coil 460, the second coil 470, and the first coil 450 between terminals of the measurement circuit.

The system 400 includes a first coil 450 including one or more turns of trace on the layer of the circuit board, adjacent to the first trace 240. The first coil 450 may be positioned to inductively couple to the first trace 240. For example, an edge of the first coil 450 may be within one millimeter of an edge of the first trace 240. In some implementations, the first coil 450 includes two or more turns (e.g., four turns) arranged in a spiral.

The system 400 includes a second coil 470 including one or more turns of trace on the layer of the circuit board, adjacent to the second trace 242. The second coil 470 may be positioned to inductively couple to the second trace 242. For example, an edge of the second coil 470 may be within one millimeter of an edge of the second trace 242. In some implementations, the second coil 470 includes two or more turns (e.g., four turns) arranged in a spiral.

The system 400 includes a third coil 460 including one or more turns of trace on the layer of the circuit board, adjacent to the first trace 240, on an opposite side of the first trace 240 from the first coil 450. For example, the third coil 460 may be positioned to inductively couple to the first trace 240. For example, the first coil 450 and the third coil 460 may have opposite winding directions.

The system 400 includes a fourth coil 480 including one or more turns of trace on the layer of the circuit board, adjacent to the second trace 242, on an opposite side of the second trace 242 from the second coil 470. For example, the fourth coil 480 may be positioned to inductively couple to the second trace 242. For example, the second coil 470 and the fourth coil 480 may have opposite winding directions.

The second coil 470 is connected in series with the first coil 450 between terminals of a measurement circuit (e.g., the measurement circuit 160) (not shown in FIG. 4) to measure a current flowing through the first trace 240 and the second trace 242. The fourth coil 480 is connected in series with the third coil 460, the second coil 470, and the first coil 450 between terminals of the measurement circuit. For example, the second coil 470 and the first coil 450 may be wound in opposite direction (e.g., 180 degrees out of phase). For example, an output (e.g., a voltage) of the measurement circuit may be proportional to a current (I) flowing in the first trace 240 and the second trace 242 in a format that may be read and/or utilized by other circuitry, such as, a processor or microcontroller that controls an inverter and/or the rectifier 220 or a transformer protection circuit that is configured to protect the transformer 210 in the event of a fault condition.

In some implementations (not shown in FIG. 4), four coils may be positioned on both sides of two traces respectively connected to two taps of the transformer 210 that both bear a current through a winding of the transformer 210. The four coils may be coplanar with their respective current bearing lengths of conductor. Thus, the set of four coils do not necessarily need to be implemented on a circuit board with traces. Such a system may include a first coil including two or more turns of conductor in a spiral arrangement that is coplanar with the first length of conductor, and adjacent to the first length of conductor. This system may include a second coil including two or more turns of conductor in a spiral arrangement that is coplanar with the second length of conductor, adjacent to the second length of conductor. This system may include a third coil including two or more turns of conductor in a spiral arrangement that is coplanar with the first length of conductor, adjacent to the first length of conductor, on an opposite side of the first length of conductor from the first coil. This system may include a fourth coil including two or more turns of conductor in a spiral arrangement that is coplanar with the second length of conductor, adjacent to the second length of conductor, on an opposite side of the second length of conductor from the second coil. The second coil may be connected in series with the first coil between terminals of a measurement circuit (e.g., the measurement circuit 160). The fourth coil may be connected in series with the third coil, the second coil, and the first coil between terminals of the measurement circuit.

In some implementations (not shown in FIG. 4), two coils are both positioned coplanar with a first length of conductor (e.g., a wire or a trace on a circuit board), along a same side of the first length of conductor, and adjacent to the first length of conductor. For example, a system may include a first coil including two or more turns of conductor in a spiral arrangement that is coplanar with the first length of conductor, and adjacent to the first length of conductor. The system may also include a second coil including two or more turns of conductor in a spiral arrangement that is coplanar with a first length of conductor, adjacent to the first length of conductor, on a same side of the first length of conductor as the first coil. The second coil may be connected in series with the first coil between terminals of a measurement circuit (e.g., the measurement circuit 160).

For example, where the first length of conductor is first trace on a layer of a circuit board, a system may include a first coil including one or more turns of trace on the layer of the circuit board, adjacent to the first trace. The system may also include a second coil including one or more turns of trace on the layer of the circuit board, adjacent to the first trace, on a same side of the first trace as the first coil. The second coil may be connected in series with the first coil between terminals of a measurement circuit (e.g., the measurement circuit 160).

For example, where the first length of conductor is first trace on a layer of a circuit board, a system may include a first coil including one or more turns of trace on the layer of the circuit board, positioned to inductively couple to the first trace. The system may also include a second coil including one or more turns of trace on the layer of the circuit board, positioned to inductively couple to the first trace, on a same side of the first trace as the first coil. The second coil may be connected in series with the first coil between terminals of a measurement circuit (e.g., the measurement circuit 160).

Figure 5:
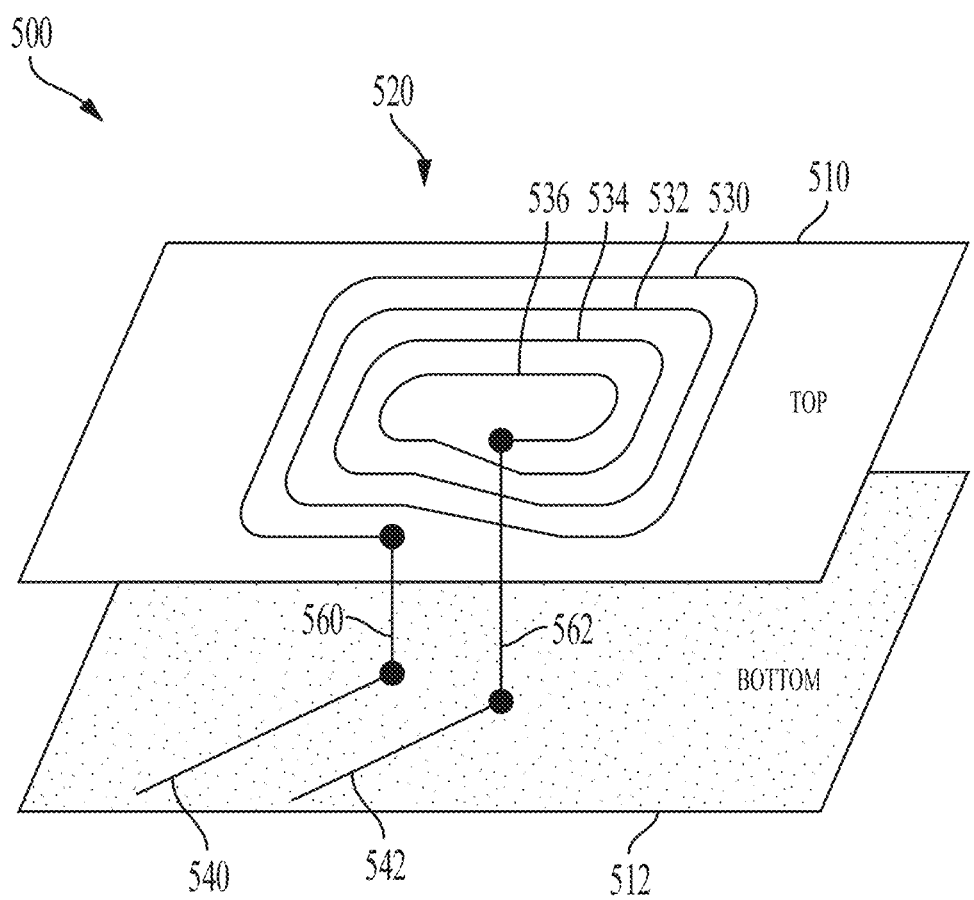
FIG. 5 is an illustration of an example of a system including a two-layer circuit board with a coil for sensing current.

FIG. 5 is an illustration of an example of a system 500 including a two-layer circuit board with a coil for sensing current. The system 500 includes a two-layer circuit board (e.g., a PCB) that includes a top layer 510 and a bottom layer 512. The system 500 includes a coil 520 that includes turns of trace (e.g., copper trace) on the top layer 510 of the circuit board. The coil 520 is connected to a first terminal 540 on the bottom layer 512 by a first via 560. The coil 520 is connected to a second terminal 542 on the bottom layer 512 by a second via 562. The coil 520 includes a first turn 530, a second turn 532, a third turn 534, and a fourth turn 536 that spiral successively inward on the top layer 510, from the first via 560 to the second via 562. For example, the coil 520 may be used to implement a coil of the system 100 of FIG. 1, of the system 200 of FIG. 2, of the system 300 of FIG. 3, or of the system 400 of FIG. 4.

Figure 6:
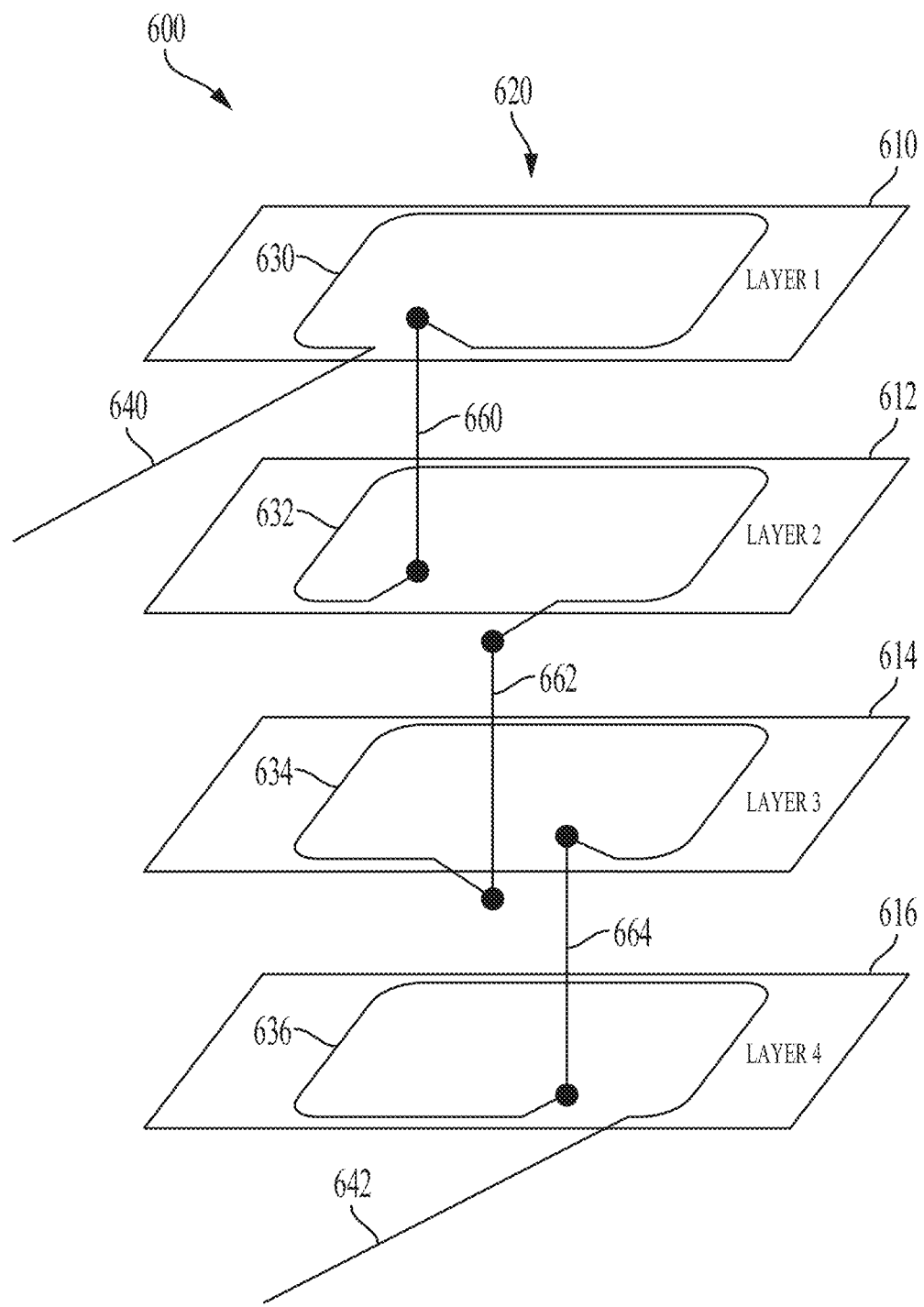
FIG. 6 is an illustration of an example of a system including a four-layer circuit board with a stack of coils in series for sensing current.

FIG. 6 is an illustration of an example of a system 600 including a four-layer circuit board with a stack of coils in series for sensing current. The system 600 includes a four-layer circuit board (e.g., a PCB) that includes a first layer 610 (e.g., a top layer), a second layer 612 (e.g., a hidden layer), a third layer 614 (e.g., a hidden layer), and a fourth layer 616 (e.g., a bottom layer). The system 600 includes a stack of coils 620 that each include one or more turns of trace (e.g., copper trace) on a respective layer of the circuit board. The stack of coils 620 is connected in series by vias (660, 662, and 664). The stack of coils 620 is connected to a first terminal 640 on the first layer 610. The stack of coils 620 is connected to a second terminal 642 on the fourth layer 616. For example, the coils (630, 632, 634, and 636) of the stack of coils 620 may have the same winding direction. For example, the stack of coils 620 may be used to implement a current sensor the system 100 of FIG. 1, of the system 200 of FIG. 2, of the system 300 of FIG. 3, or of the system 400 of FIG. 4.

The system 600 includes a first coil 630 on the first layer 610. Although not shown in FIG. 6, the first layer 610 may also include a first trace (e.g., the first length of conductor 170 or the first trace 240) that is adjacent to and/or inductively coupled to the first coil 630. This first trace may bear a time varying current that is measured using a current sensor that includes the stack of coils 620 (e.g., as described in relation to FIG. 1). The system includes a second coil 632 including one or more turns of trace on an additional layer (i.e., the second layer 612) of the circuit board, stacked vertically with the first coil 630. The second coil 632 is connected in series with the first coil 630 between terminals (e.g., the first terminal 640 and the second terminal 642) of a measurement circuit (e.g., the measurement circuit 160) (not shown in FIG. 6). The second coil 632 is connected to the first coil 630 by the via 660. The system includes a third coil 634 including one or more turns of trace on an additional layer (i.e., the third layer 614) of the circuit board, stacked vertically with the first coil 630. The third coil 634 is connected in series with the first coil 630 between terminals (e.g., the first terminal 640 and the second terminal 642) of a measurement circuit. The third coil 634 is connected to the second coil 632 by the via 662. The system includes a fourth coil 636 including one or more turns of trace on an additional layer (i.e., the fourth layer 616) of the circuit board, stacked vertically with the first coil 630. The fourth coil 636 is connected in series with the first coil 630 between terminals (e.g., the first terminal 640 and the second terminal 642) of a measurement circuit. The fourth coil 636 is connected to the third coil 634 by the via 664.

Figure 7:
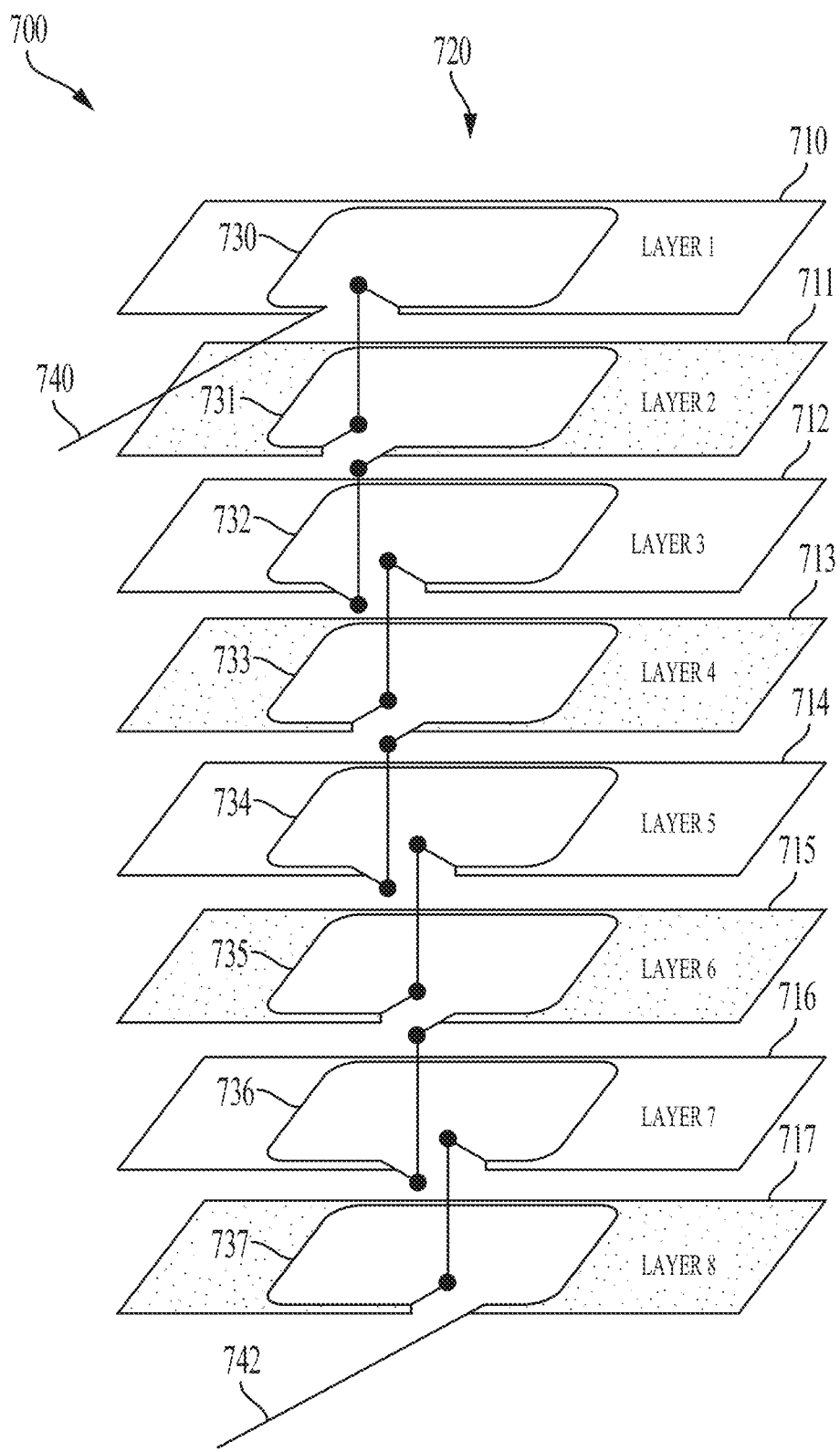
FIG. 7 is an illustration of an example of a system including an eight-layer circuit board with a stack of coils in series for sensing current.

FIG. 7 is an illustration of an example of a system 700 including an eight-layer circuit board with a stack of coils in series for sensing current. The system 700 includes an eight-layer circuit board (e.g., a PCB) that includes a first layer 710 (e.g., a top layer), a second layer 711 (e.g., a hidden layer), a third layer 712 (e.g., a hidden layer), a fourth layer 713 (e.g., a hidden layer), a fifth layer 714 (e.g., a hidden layer), a sixth layer 715 (e.g., a hidden layer), a seventh layer 716 (e.g., a hidden layer), and an eighth layer 717 (e.g., a bottom layer). The system 700 includes a stack of coils 720 that each include one or more turns of trace (e.g., copper trace) on a respective layer of the circuit board. The stack of coils 720 is connected in series by vias. The stack of coils 720 is connected to a first terminal 740 on the first layer 710. The stack of coils 720 is connected to a second terminal 742 on the eighth layer 717. For example, the coils (730, 731, 732, 733, 734, 735, 736, and 737) of the stack of coils 720 may have the same winding direction. For example, the stack of coils 720 may be used to implement a current sensor the system 100 of FIG. 1, of the system 200 of FIG. 2, of the system 300 of FIG. 3, or of the system 400 of FIG. 4.

The system 700 includes a first coil 730 on the first layer 710. Although not shown in FIG. 7, the first layer 710 may also include a first trace (e.g., the first length of conductor 170 or the first trace 240) that is adjacent to and/or inductively coupled to the first coil 730. This first trace may bear a time varying current that is measured using a current sensor that includes the stack of coils 720 (e.g., as described in relation to FIG. 1). The system includes a second coil 731 including one or more turns of trace on an additional layer (i.e., the second layer 711) of the circuit board, stacked vertically with the first coil 730. The second coil 731 is connected in series with the first coil 730 between terminals (e.g., the first terminal 740 and the second terminal 742) of a measurement circuit (e.g., the measurement circuit 160) (not shown in FIG. 7). The second coil 731 is connected to the first coil 730 by a via. The system includes a third coil 732 including one or more turns of trace on an additional layer (i.e., the third layer 712) of the circuit board, stacked vertically with the first coil 730. The third coil 732 is connected in series with the first coil 730 between terminals (e.g., the first terminal 740 and the second terminal 742) of a measurement circuit. The third coil 732 is connected to the second coil 731 by a via. The system includes a fourth coil 733 including one or more turns of trace on an additional layer (i.e., the fourth layer 713) of the circuit board, stacked vertically with the first coil 730. The fourth coil 733 is connected in series with the first coil 730 between terminals (e.g., the first terminal 740 and the second terminal 742) of a measurement circuit. The fourth coil 733 is connected to the third coil 732 by a via. The system includes a fifth coil 734 including one or more turns of trace on an additional layer (i.e., the fifth layer 714) of the circuit board, stacked vertically with the first coil 730. The fifth coil 734 is connected in series with the first coil 730 between terminals (e.g., the first terminal 740 and the second terminal 742) of a measurement circuit. The fifth coil 734 is connected to the fourth coil 733 by a via. The system includes a sixth coil 735 including one or more turns of trace on an additional layer (i.e., the sixth layer 715) of the circuit board, stacked vertically with the first coil 730. The sixth coil 735 is connected in series with the first coil 730 between terminals (e.g., the first terminal 740 and the second terminal 742) of a measurement circuit. The sixth coil 735 is connected to the fifth coil 734 by a via. The system includes a seventh coil 736 including one or more turns of trace on an additional layer (i.e., the seventh layer 716) of the circuit board, stacked vertically with the first coil 730. The seventh coil 736 is connected in series with the first coil 730 between terminals (e.g., the first terminal 740 and the second terminal 742) of a measurement circuit. The seventh coil 736 is connected to the sixth coil 735 by a via. The system includes an eighth coil 737 including one or more turns of trace on an additional layer (i.e., the eighth layer 717) of the circuit board, stacked vertically with the first coil 730. The eighth coil 737 is connected in series with the first coil 730 between terminals (e.g., the first terminal 740 and the second terminal 742) of a measurement circuit. The eighth coil 737 is connected to the seventh coil 736 by a via.

Figure 8:
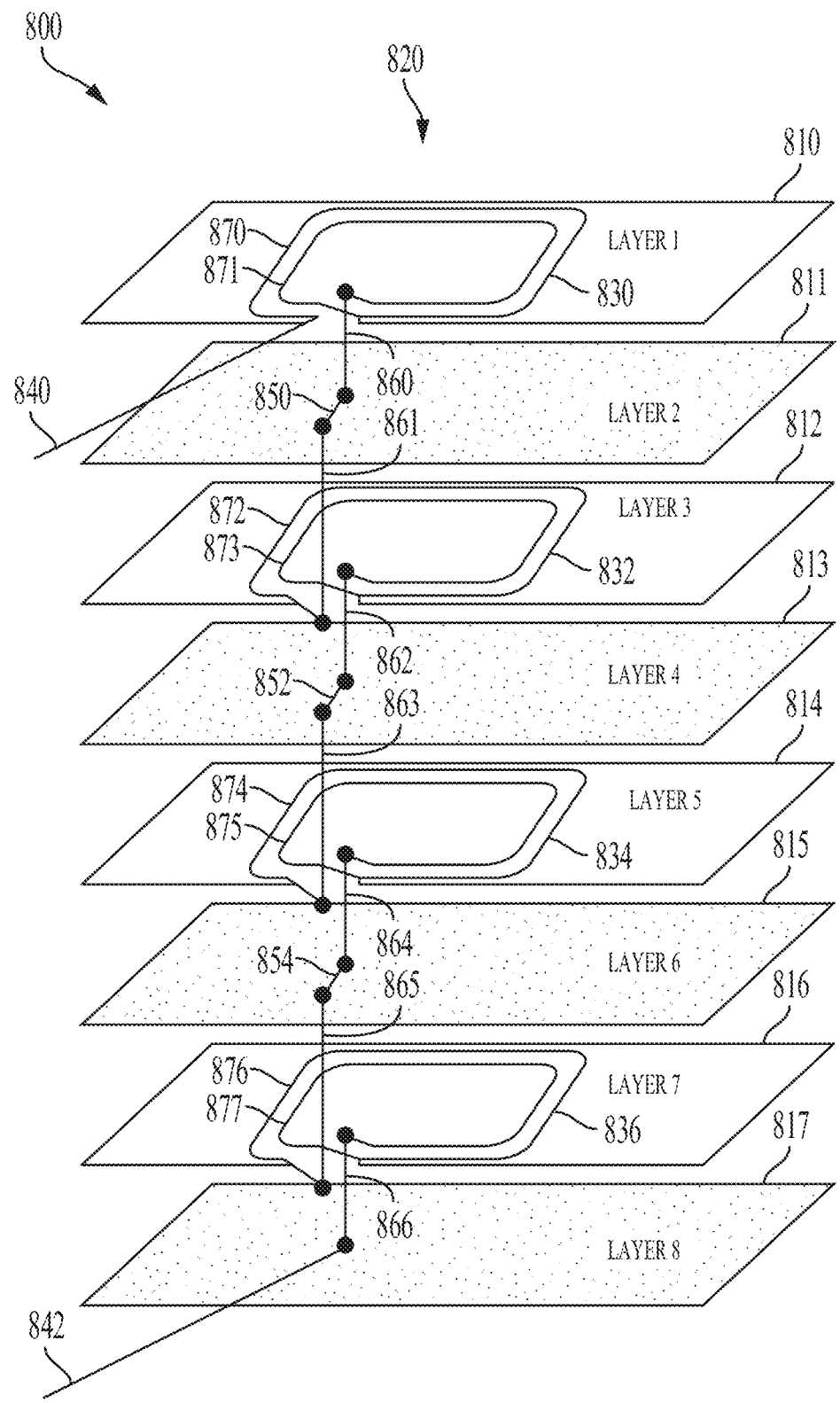
FIG. 8 is an illustration of an example of a system including an eight-layer circuit board with a stack of coils in series for sensing current.

FIG. 8 is an illustration of an example of a system 800 including an eight-layer circuit board with a stack of coils in series for sensing current. The system 800 includes an eight-layer circuit board (e.g., a PCB) that includes a first layer 810 (e.g., a top layer), a second layer 811 (e.g., a hidden layer), a third layer 812 (e.g., a hidden layer), a fourth layer 813 (e.g., a hidden layer), a fifth layer 814 (e.g., a hidden layer), a sixth layer 815 (e.g., a hidden layer), a seventh layer 816 (e.g., a hidden layer), and an eighth layer 817 (e.g., a bottom layer). The system 800 includes a stack of coils 820 that each include one or more turns of trace (e.g., copper trace) on a respective layer of the circuit board. In this example, the stack of coils 820 includes four coils (830, 832, 834, and 836), each including two turns of trace for a total of eight turns of trace in the stack of coils 820. The stack of coils 820 is connected in series by vias (860-865). The stack of coils 820 is connected to a first terminal 840 on the first layer 810. The stack of coils 820 is connected to a second terminal 842 on the eighth layer 817. For example, the coils of the stack of coils 820 may have the same winding direction. For example, the stack of coils 820 may be used to implement a current sensor the system 100 of FIG. 1, of the system 200 of FIG. 2, of the system 300 of FIG. 3, or of the system 400 of FIG. 4.

The system 800 includes a first coil 830 on the first layer 810. The first coil 830 includes a first turn 870 and a second turn 871 that spiral successively inward on the first layer 810, from the first terminal 840 to the via 860. Although not shown in FIG. 8, the first layer 810 may also include a first trace (e.g., the first length of conductor 170 or the first trace 240) that is adjacent to and/or inductively coupled to the first coil 830. This first trace may bear a time varying current that is measured using a current sensor that includes the stack of coils 820 (e.g., as described in relation to FIG. 1). The system includes a second coil 832 including one or more turns of trace on an additional layer (i.e., the third layer 812) of the circuit board, stacked vertically with the first coil 830. The second coil 832 is connected in series with the first coil 830 between terminals (e.g., the first terminal 840 and the second terminal 842) of a measurement circuit (e.g., the measurement circuit 160) (not shown in FIG. 8). The second coil 832 is connected to the first coil 830 by the via 860, an in-out trace 850 on the second layer 811, and the via 861. The second coil 832 includes a third turn 872 and a fourth turn 873 that spiral successively inward on the third layer 812, from the via 861 to the via 862. The system includes a third coil 834 including one or more turns of trace on an additional layer (i.e., the fifth layer 814) of the circuit board, stacked vertically with the first coil 830. The third coil 834 is connected in series with the first coil 830 between terminals (e.g., the first terminal 840 and the second terminal 842) of a measurement circuit. The third coil 834 is connected to the second coil 832 by the via 862, an in-out trace 852 on the fourth layer 813, and the via 863. The third coil 834 includes a fifth turn 874 and a sixth turn 875 that spiral successively inward on the fifth layer 814, from the via 863 to the via 864. The system includes a fourth coil 836 including one or more turns of trace on an additional layer (i.e., the seventh layer 816) of the circuit board, stacked vertically with the first coil 830. The fourth coil 836 is connected in series with the first coil 830 between terminals (e.g., the first terminal 840 and the second terminal 842) of a measurement circuit. The fourth coil 836 is connected to the third coil 834 by the via 864, an in-out trace 854 on the sixth layer 815, and the via 865. The fourth coil 836 includes a seventh turn 876 and an eighth turn 877 that spiral successively inward on the seventh layer 816, from the via 865 to the via 866. The fourth coil 836 is connected to the second terminal 842 by the via 866.

Figure 9:
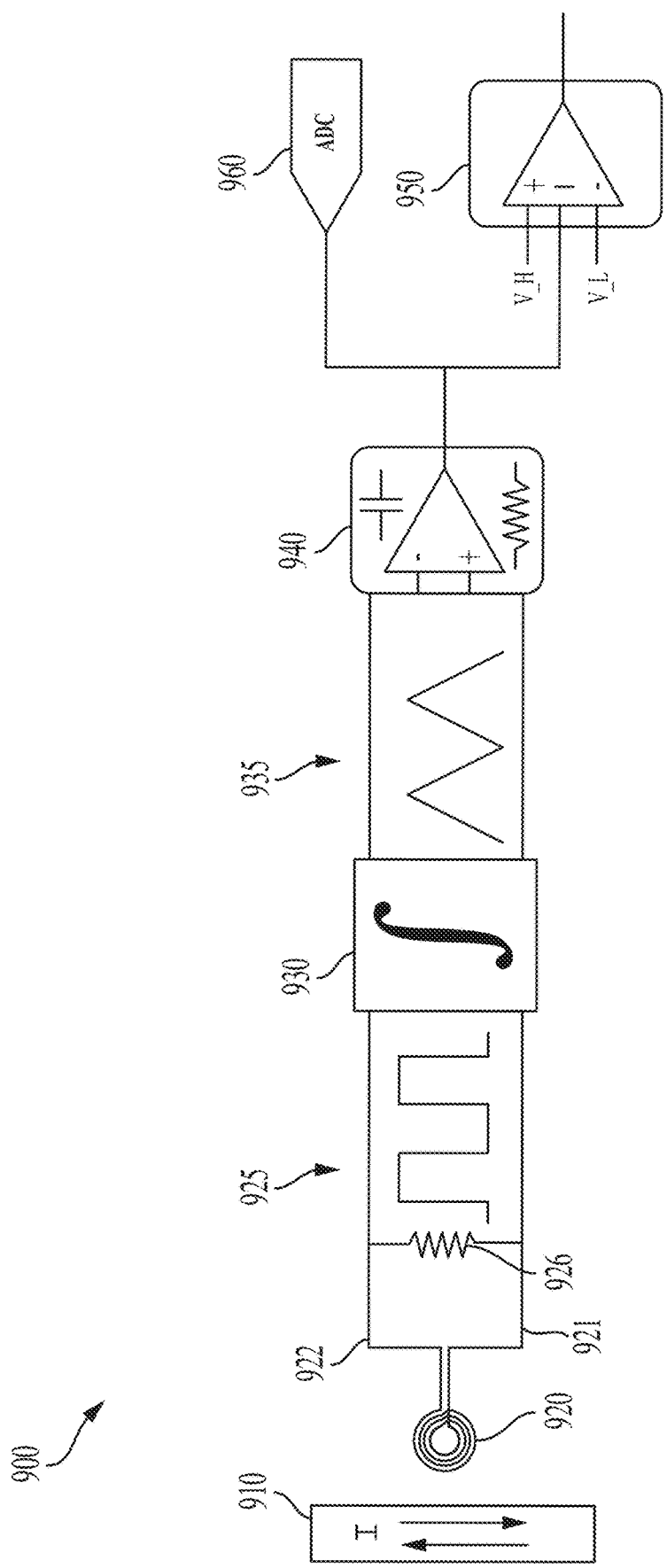
FIG. 9 is a circuit diagram of an example of a system including a current sensor.

FIG. 9 is a circuit diagram of an example of a system 900 including a current sensor. The system 900 includes a current sensor configured to measure time varying current flowing in the conductor 910 (e.g., a wire or a trace on a circuit board), where the circuit driving the current in the conductor 910 is not shown in FIG. 9. For example, the conductor 910 may be the first length of conductor 170 or the first trace 240. The system 900 includes a set of one or more coils 920 that are in series between a first terminal 921 and a second terminal 922. The set of one or more coils 920 may be positioned near the conductor 910 to facilitate current sensing. For example, the set of one or more coils 920 may be positioned adjacent to the conductor and/or such that the set of one or more coils 920 are inductively coupled to the conductor 910. For example, the set of one or more coils 920 may be positioned in relation to the conductor 910 as described in relation to FIG. 1, FIG. 2, FIG. 3, FIG. 4, FIG. 5, FIG. 6, FIG. 7, and/or FIG. 8. A measurement circuit, including an integrator circuit 930 and a signal conditioning circuit 940, is connected between the first terminal 921 and the second terminal 922. The voltage signal 925 across the set of one or more coils 920 are dropped across a resistor 926. For example, the voltage signal 925 may approximate a square wave.

The voltage signal 925 is input to an integrator circuit 930. A time varying current through the conductor 910 induces a magnetic field. According to Faradays Law, this time varying magnetic field induces a voltage in the set of one or more coils 920. This voltage across the coil 150 can be integrated to result in a parameter (e.g., a voltage) proportionate to current flowing in the conductor 910. For example, the integrator circuit 930 may include a resistor-capacitor network (an RC network) that integrates the voltages by storing charge on one or more capacitors. For example, the integrator circuit 930 may be implemented as described in relation to the measurement circuit 1030 of FIG. 10. For example, an output signal 935 of the integrator circuit 930 may approximate a triangle wave that is proportional to the current flowing in the conductor 910 with a small phase shift (e.g., less than one nanosecond).

The output signal 935 is input to a signal conditioning circuit 940. For example, the signal conditioning circuit 940 may be configured to perform differential to single-ended signal conversion and/or bias adjustment. In some implementations, the signal conditioning circuit 940 may apply additional filtering to clean up the output signal 935 and suppress noise. The signal conditioning circuit 940 may output a conditioned signal (e.g., a voltage signal) that is an estimate of the current flowing in the conductor 910 with a small phase shift (e.g., less than one nanosecond) in a format that is accessible by additional circuitry for control and/or protection of a power converter that includes the conductor 910.

The system 900 includes a comparator circuit 950 configured to detect, based on an estimate of current from the integrator circuit 930 (e.g., the conditioned signal output by the signal conditioning circuit), whether current flowing in the conductor 910 (e.g., the first length of conductor 170 or the first trace 240) is outside of a range (e.g., an expected or safe range of currents for a transformer or other power converter device). The comparator circuit 950 may be configured for protection of a transformer or another device. In some implementations, the comparator circuit 950 is configured to, responsive to detection of current outside of the range, generate a signal to cause a circuit (e.g., the inverter 120 or the rectifier 130) connected to a transformer (e.g., the transformer 110) to be opened to stop current from flowing in the transformer. For example, the comparator circuit 950 may be configured to protect the transformer 110 in the event of a fault condition. For example, the comparator circuit 950 may be implemented as the comparator circuit 1050 of FIG. 10.

The system 900 includes and analog-to-digital converter (ADC) 960. For example, the ADC 960 may be part of an interface to a processor (e.g., a microprocessor or a microcontroller) that is configured to control a power converter that includes the conductor 910. For example, the conditioned signal (e.g., a voltage signal) that is an estimate of the current flowing in the conductor 910 may be input to the ADC 960 for sampling and quantization to convert the analog signal to a sequence of digital current estimates that can be processed by a digital control system that controls switches in the power converter (e.g., switches in the inverter 120 and/or the rectifier 130).

Figure 10:
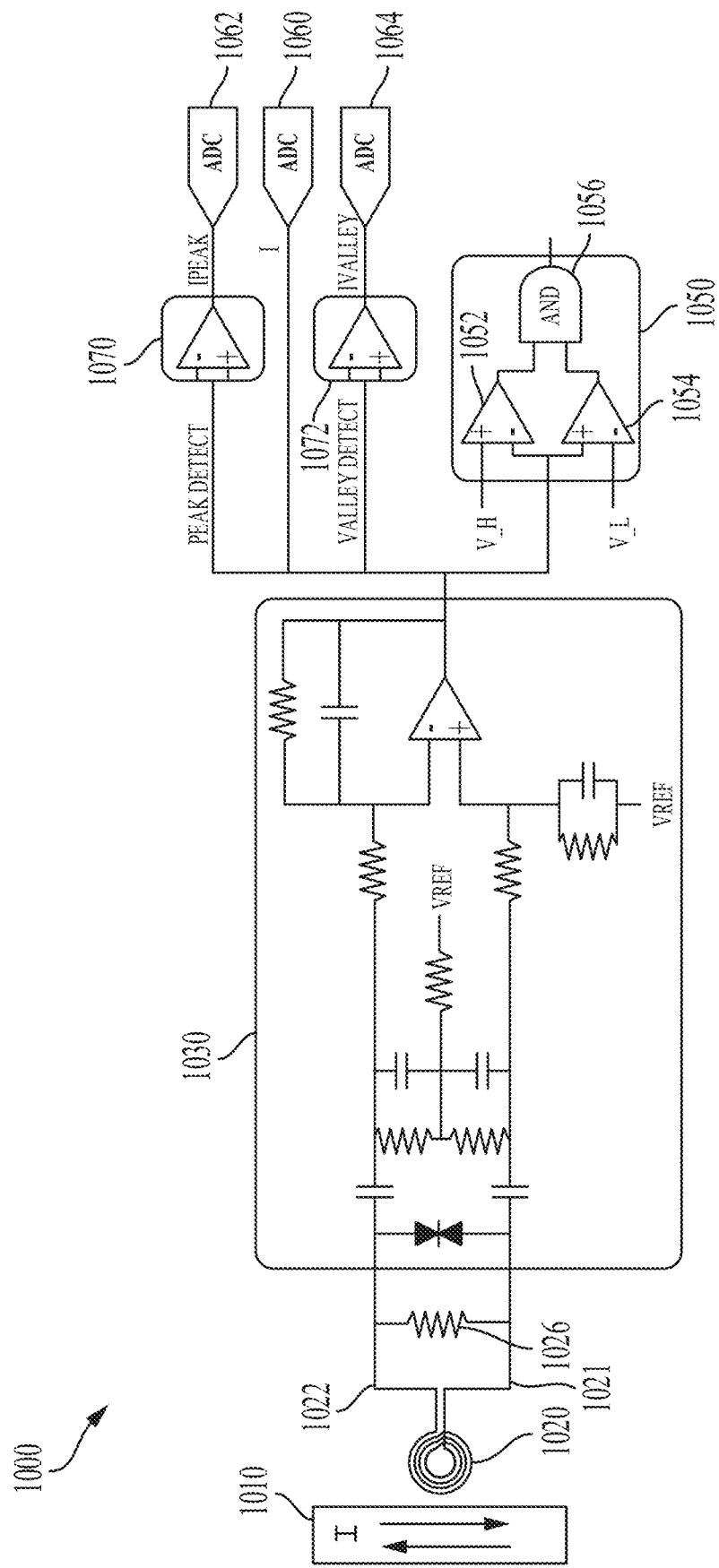
FIG. 10 is a circuit diagram of an example of a system including a current sensor.

FIG. 10 is a circuit diagram of an example of a system 1000 including a current sensor. The system 1000 includes a current sensor configured to measure time varying current flowing in the conductor 1010 (e.g., a wire or a trace on a circuit board), where the circuit driving the current in the conductor 1010 is not shown in FIG. 10. For example, the conductor 1010 may be the first length of conductor 170 or the first trace 240. The system 1000 includes a set of one or more coils 1020 that are in series between a first terminal 1021 and a second terminal 1022. The set of one or more coils 1020 may be positioned near the conductor 1010 to facilitate current sensing. For example, the set of one or more coils 1020 may be positioned adjacent to the conductor and/or such that the set of one or more coils 1020 are inductively coupled to the conductor 1010. For example, the set of one or more coils 1020 may be positioned in relation to the conductor 1010 as described in relation to FIG. 1, FIG. 2, FIG. 3, FIG. 4, FIG. 5, FIG. 6, FIG. 7, and/or FIG. 8. The voltage signal across the set of one or more coils 1020 are dropped across a resistor 1026. For example, the voltage signal may approximate a square wave.

The voltage signal is input to a measurement circuit 1030. The measurement circuit 1030 configured to combine the functions of the integrator circuit 930 and the signal conditioning circuit 940 of FIG. 9. The measurement circuit 1030 includes a resistor-capacitor network (an RC network) that integrates the voltages by storing charge on capacitors. The RC values may depend on cut-off frequency used for the filter design and can vary significantly between different implementations. The measurement circuit 1030 also includes a pair of opposing diodes across the input terminals of the measurement circuit 1030 for surge protection in the current sensor of the system 1000. For example, the integrator circuit 930 may be configured to perform differential to single-ended signal conversion and/or bias adjustment using an operational amplifier in a closed loop configuration. For example, an output signal of the measurement circuit 1030 may approximate a triangle wave that is proportional to the current flowing in the conductor 1010 with a small phase shift (e.g., less than one nanosecond). For example, an output signal of the measurement circuit 1030 may be a conditioned signal (e.g., a voltage signal) that is an estimate of the current flowing in the conductor 1010 with a small phase shift (e.g., less than 1 nanosecond) in a format that is accessible by additional circuitry for control and/or protection of a power converter that includes the conductor 1010.

The system 1000 includes a comparator circuit 1050 configured to detect, based on an estimate of current from the measurement circuit 1030 (e.g., the conditioned signal output), whether current flowing in the conductor 1010 (e.g., the first length of conductor 170 or the first trace 240) is outside of a range (e.g., an expected or safe range of currents for a transformer or other power converter device). The comparator circuit 1050 may be configured for protection of a transformer or another device. In some implementations, the comparator circuit 1050 is configured to, responsive to detection of current outside of the range, generate a signal to cause a circuit (e.g., the inverter 120 or the rectifier 130) connected to a transformer (e.g., the transformer 110) to be opened to stop current from flowing in the transformer. For example, the comparator circuit 1050 may be configured to protect the transformer 110 in the event of a fault condition.

The comparator circuit 1050 includes a first operational amplifier 1052 configured as an open-loop comparator to compare a voltage representing a current estimate of the current flowing in the conductor 1010 to a high voltage corresponding to a first end of the range of safe current values. The comparator circuit 1050 includes a second operational amplifier 1054 configured as an open-loop comparator to compare a voltage representing a current estimate of the current flowing in the conductor 1010 to a low voltage corresponding to a second end of the range of safe current values. The comparator circuit 1050 includes a logical AND gate 1056 configured to combine the outputs of the first operational amplifier 1052 and the second operational amplifier 1054 to generate a signal to cause a circuit (e.g., the inverter 120 or the rectifier 130) connected to a transformer (e.g., the transformer 110) to be opened to stop current from flowing in the transformer. For example, the output of the logical AND gate 1056 may indicate whether a fault condition has occurred in a power converter including the conductor 1010.

The system 1000 includes and analog-to-digital converter (ADC) 1060. For example, the ADC 1060 may be part of an interface to a processor (e.g., a microprocessor or a microcontroller) that is configured to control a power converter that includes the conductor 1010. For example, the conditioned signal (e.g., a voltage signal) that is an estimate of the current flowing in the conductor 1010 may be input to the ADC 1060 for sampling and quantization to convert the analog signal to a sequence of digital current estimates that can be processed by a digital control system that controls switches in the power converter (e.g., switches in the inverter 120 and/or the rectifier 130).

The system 1000 includes a peak detection circuit 1070 configured to generate an estimate of peak current in the conductor 1010 (e.g., the first length of conductor 170 or the first trace 240) based on estimates of current from the measurement circuit 1030. For example, the peak detection circuit 1070 may include an operational amplifier. The resulting estimate of peak current is input to an ADC 1062. For example, the ADC 1062 may be part of an interface to a processor (e.g., a microprocessor or a microcontroller) that is configured to control a power converter that includes the conductor 1010.

The system 1000 includes a valley detection circuit 1072 configured to generate an estimate of valley current in the conductor 1010 (e.g., the first length of conductor 170 or the first trace 240) based on estimates of current from the measurement circuit 1030. For example, the valley detection circuit 1072 may include an operational amplifier. The resulting estimate of valley current is input to an ADC 1064. For example, the ADC 1064 may be part of an interface to a processor (e.g., a microprocessor or a microcontroller) that is configured to control a power converter that includes the conductor 1010.

Although not shown in FIG. 10, the system 1000 may include a processor (e.g., a microprocessor or a microcontroller) configured to receive (e.g., through the ADC 1062) the estimate of peak current from the peak detection circuit 1070, receive (e.g., through the ADC 1064) the estimate of valley current from the valley detection circuit 1072, and determine a prediction of a current in a rectifier (e.g., the rectifier 130) based on the estimate of peak current and the estimate of valley current. For example, the prediction of the rectified current may be determined based on the estimates of peak current and valley current in a transformer (e.g., the transformer 110) using a model converter implemented using a look-up table and/or a mathematical formula.

When conductors (e.g., traces or wires) connected to terminals of a transformer (TRF− and TRF+) are close together a coil for sensing current from the transformer may be positioned in the middle, between the conductors of the TRF− and TRF+ terminals. In some implementations, multiple coils connected in series may be used to capture more flux and induce more voltage. Another significant motivation to use multiple coils may be for canceling any stray flux, similar to a differential measurement. For example, one coil may be positioned in the middle of TRF− and TRF+ terminals. For example, three coils may be used, with one positioned between the conductors for the transformer terminals TRF+ and TRF−, and two coils positioned on respective opposite sides of the conductors from the first coil. For example, alternate coils may be wound 180 degrees out of phase.

Figure 11:
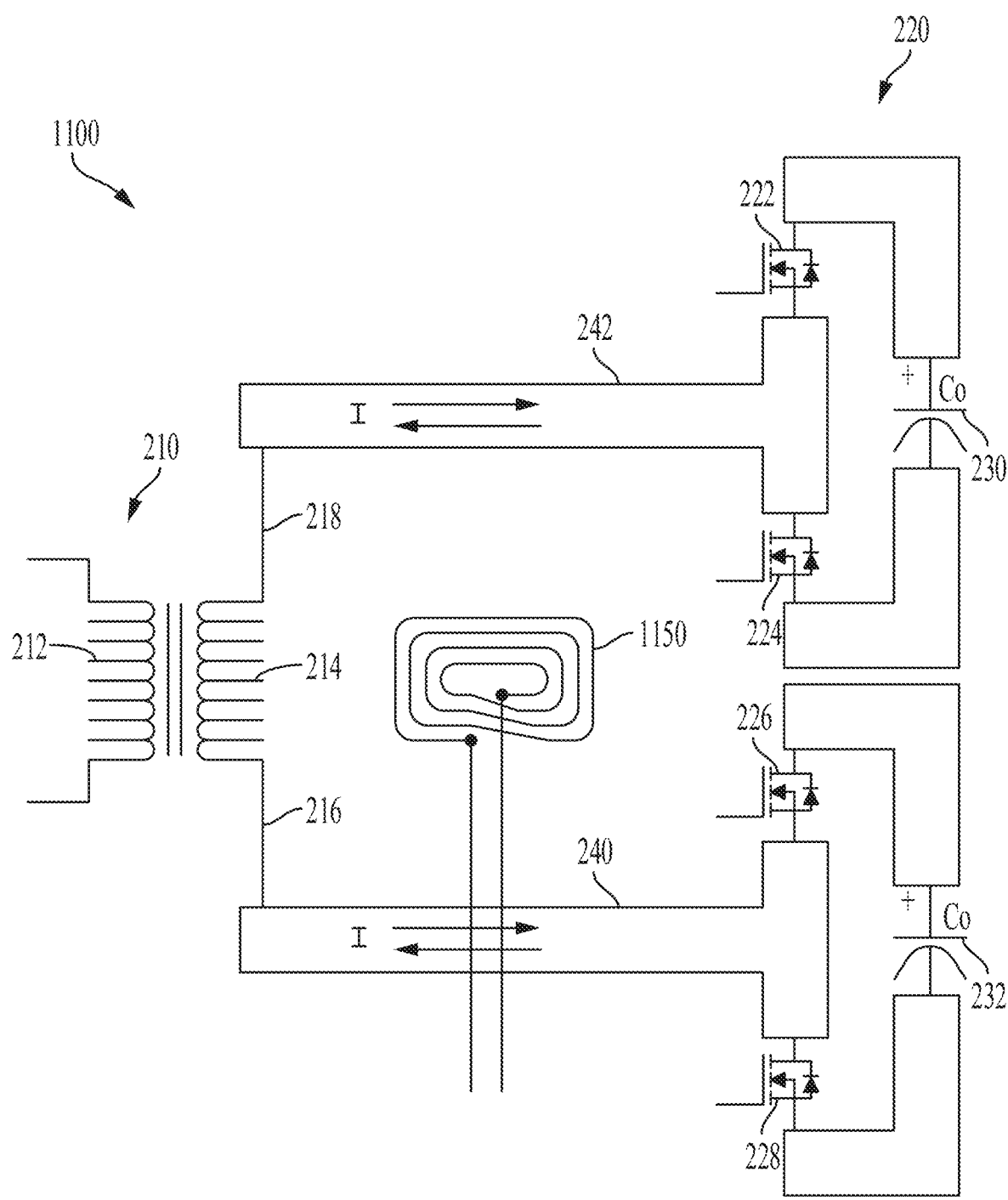
FIG. 11 is a circuit diagram of an example of a system including a power converter with a coil for sensing current.

FIG. 11 is a circuit diagram of an example of a system 1100 including a power converter with a coil 1150 for sensing current. The system 1100 includes the transformer 210 and the rectifier 220 of FIG. 2, connected by the first trace 240 and the second trace 242 on a layer of a circuit board. The system 1100 includes a coil 1150 including one or more turns of trace on the layer of the circuit board, adjacent to the first trace 240 and adjacent to the second trace 242. The coil 1150 is connected between terminals of a measurement circuit (e.g., the measurement circuit 160) (not shown in FIG. 11).

The system 1100 includes a first trace 240 on a layer of a circuit board. The first trace 240 connects the first tap 216 to the rectifier 220. The system 1100 includes a second trace 242 on the layer of the circuit board. The second trace 242 connects the second tap 218 to the rectifier 220. The second trace 242 may be connected in series with the first trace 240.

The system 1100 includes a coil 1150 including one or more turns of trace on the layer of the circuit board, adjacent to the first trace 240. The coil 1150 is adjacent to the second trace 242. For example, the coil 1150 may be positioned between (e.g., halfway between) the first trace 240 and the second trace 242. In some implementations, the coil 1150 is positioned to inductively couple to the second trace 242, and the coil 1150 is positioned to inductively couple to the first trace 240.

In some implementations (not shown in FIG. 11), a coil may be positioned coplanar with a first length of conductor (e.g., a wire or a trace) and a second length of conductor bearing current from the transformer 210 to and from a rectifier. Thus, the coil does not necessarily need to be implemented on a circuit board with traces. Such a system may include a coil including two or more turns of conductor in a spiral arrangement that is coplanar with the first length of conductor, and adjacent to the first length of conductor. The coil may also be coplanar with the second length of conductor, and adjacent to the second length of conductor. The coil may be connected between terminals of a measurement circuit (e.g., the measurement circuit 160).

Figure 12:
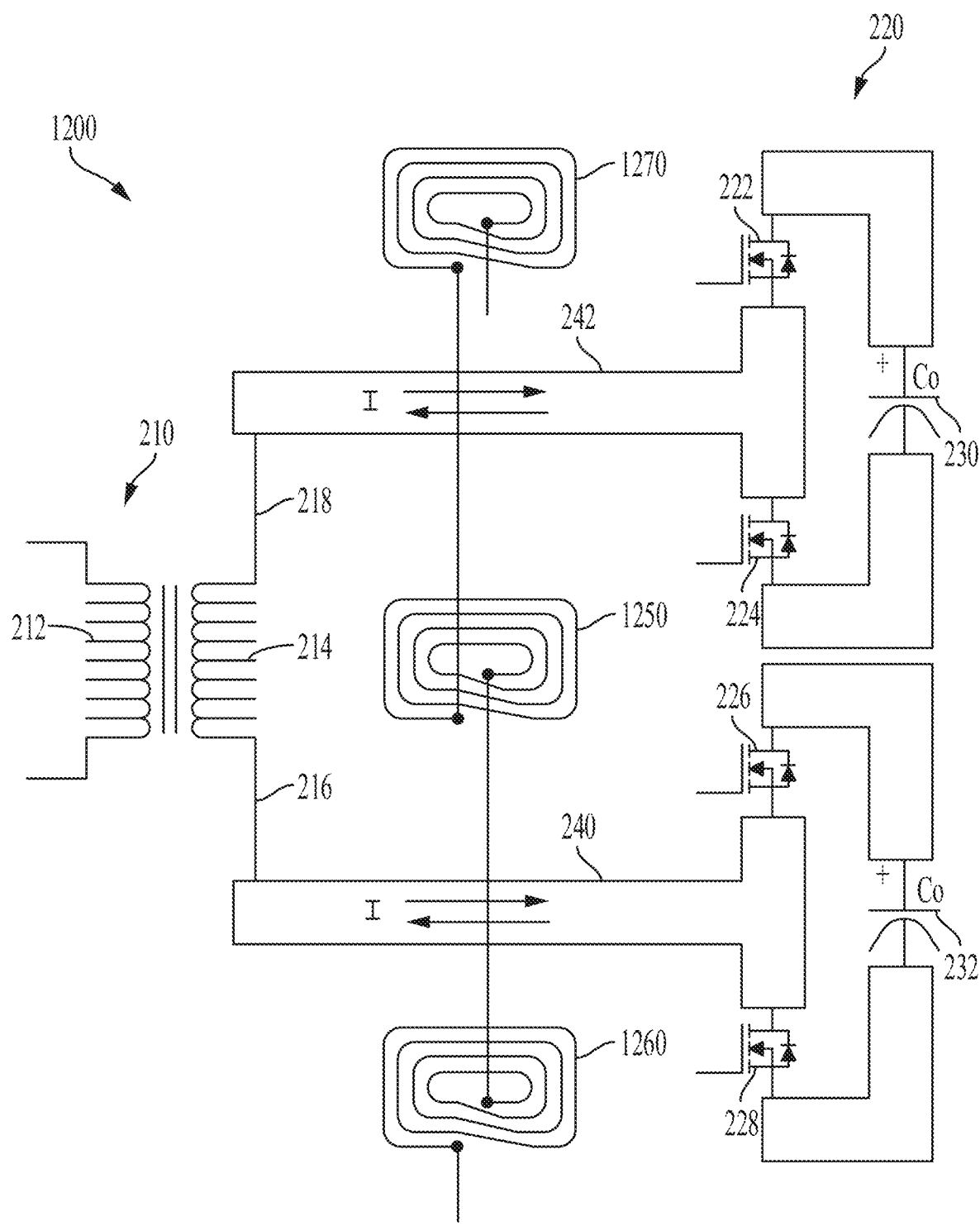
FIG. 12 is a circuit diagram of an example of a system including a power converter with three coils in series for sensing current.

FIG. 12 is a circuit diagram of an example of a system 1200 including a power converter with three coils in series for sensing current. The system 1200 includes the transformer 210 and the rectifier 220 of FIG. 2, connected by the first trace 240 and the second trace 242 on a layer of a circuit board. The system 1200 includes a first coil 1250 including one or more turns of trace on the layer of the circuit board, adjacent to the first trace 240 and adjacent to the second trace 242. The system 1200 includes a second coil 1260 including one or more turns of trace on the layer of the circuit board, adjacent to the first trace 240, on an opposite side of the first trace 240 from the first coil 1250. The system 1200 includes a third coil 1270 including one or more turns of trace on the layer of the circuit board, adjacent to the second trace 242, on an opposite side of the second trace 242 from the first coil 1250. The first coil 1250 is connected in series with the second coil 1260 and the third coil 1270 between terminals of a measurement circuit (e.g., the measurement circuit 160) (not shown in FIG. 12).

The system 1200 includes a first trace 240 on a layer of a circuit board. The first trace 240 connects the first tap 216 to the rectifier 220. The system 1200 includes a second trace 242 on the layer of the circuit board. The second trace 242 connects the second tap 218 to the rectifier 220. The second trace 242 may be connected in series with the first trace 240.

The system 1200 includes a first coil 1250 including one or more turns of trace on the layer of the circuit board, adjacent to the first trace 240. The first coil 1250 is adjacent to the second trace 242. For example, the first coil 1250 may be positioned between (e.g., halfway between) the first trace 240 and the second trace 242. In some implementations, the first coil 1250 is positioned to inductively couple to the second trace 242, and the first coil 1250 is positioned to inductively couple to the first trace 240.

The system 1200 includes a second coil 1260 including one or more turns of trace on the layer of the circuit board, adjacent to the first trace 240, on an opposite side of the first trace 240 from the first coil 1250. In some implementations, the second coil 1260 is positioned to inductively couple to the first trace 240. For example, the first coil 1250 and the second coil 1260 have opposite winding directions.

The system 1200 includes a third coil 1270 including one or more turns of trace on the layer of the circuit board, adjacent to the second trace 242, on an opposite side of the second trace 242 from the first coil 1250. In some implementations, the third coil 1270 is positioned to inductively couple to the second trace 242. For example, the first coil 1250 and the third coil 1270 have opposite winding directions. The third coil 1270 is connected in series with the second coil 1260 and the first coil 1250 between terminals of a measurement circuit (e.g., the measurement circuit 160) (not shown in FIG. 12).

In some implementations (not shown in FIG. 12), a coil may be positioned coplanar with a first length of conductor (e.g., a wire or a trace) and a second length of conductor bearing current from the transformer 210 to and from a rectifier. Thus, the coil does not necessarily need to be implemented on a circuit board with traces. Such a system may include a transformer including a secondary winding that connects a first tap and a second tap; a first length of conductor that connects the first tap to a rectifier; a first coil including two or more turns of conductor in a spiral arrangement that is coplanar with the first length of conductor, and adjacent to the first length of conductor; a second length of conductor that connects the second tap to the rectifier, wherein the first coil is coplanar with the second length of conductor, and adjacent to the second length of conductor; a second coil including two or more turns of conductor in a spiral arrangement that is coplanar with the first length of conductor, adjacent to the first length of conductor, on an opposite side of the first length of conductor from the first coil; and a third coil including two or more turns of conductor in a spiral arrangement that is coplanar with the second length of conductor, adjacent to the second length of conductor, on an opposite side of the second length of conductor from the first coil. The third coil may be connected in series with the second coil and the first coil between terminals of a measurement circuit (e.g., the measurement circuit 160) configured to estimate current flowing in the first length of conductor based on integration over time of voltage across the first coil.

When the transformer currents are high, interleaving conductors on alternate layers is one way for transformer connections to minimize losses on a circuit board (e.g., a PCB). For example, conductors connected to TRF+ and TRF− terminals may occur on respective alternate layers (e.g., stacked on top of one another). Hence, flux generated may be alternating on successive layers of the PCB. With this interleaved circuit board layout, a corresponding stack of current sensor coils may have alternate winding directions on each layer to align well with the magnetic field created on alternate PCB layers.

Figure 13:
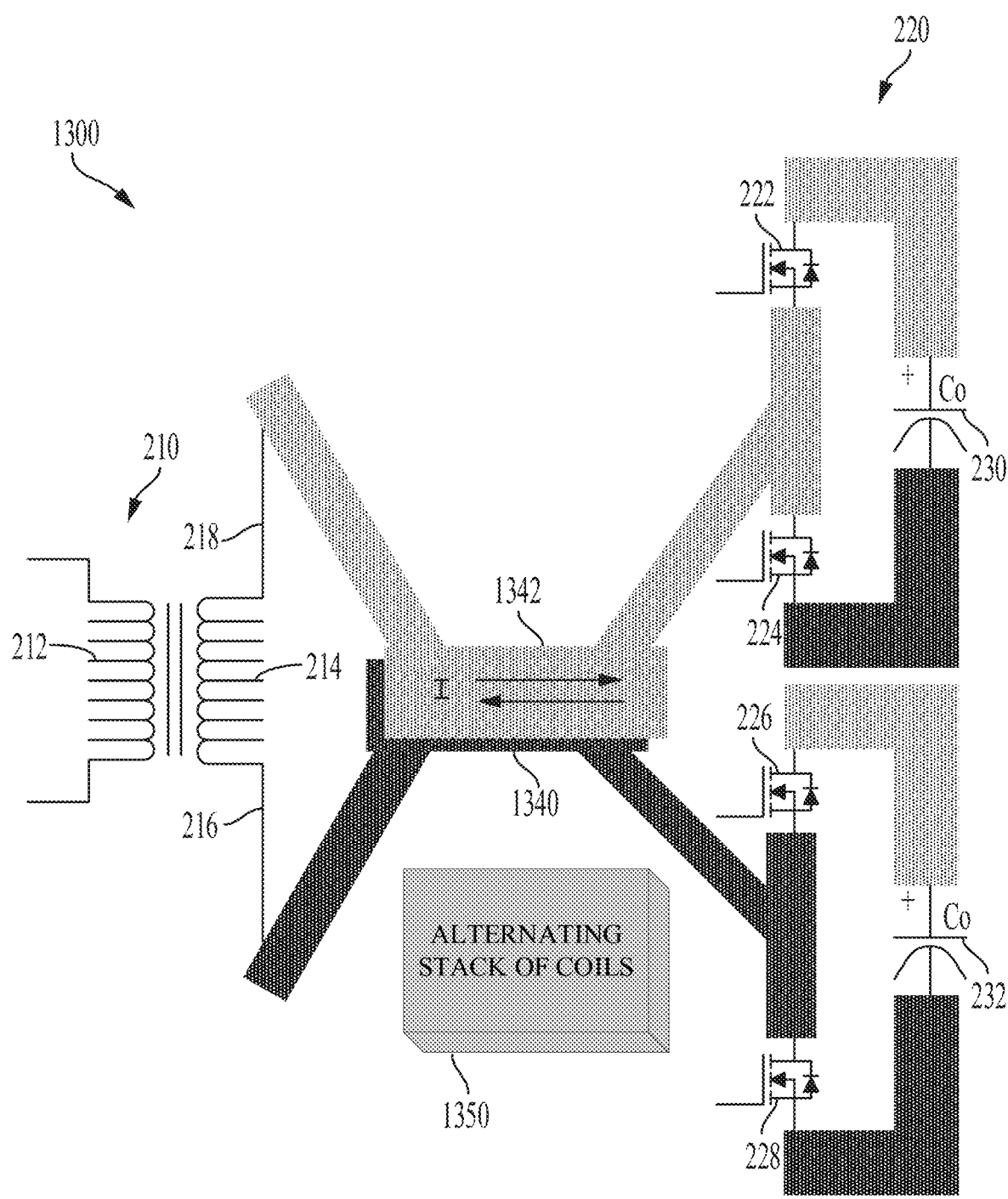
FIG. 13 is a circuit diagram of an example of a system including a power converter with a stack of interleaved conductors on multiple layers of a circuit board and a stack of coils with alternating winding directions for sensing current in the interleaved conductors.

FIG. 13 is a circuit diagram of an example of a system 1300 including a power converter with a stack of interleaved conductors on multiple layers of a circuit board and a stack of coils with alternating winding directions for sensing current in the interleaved conductors. The system 1300 includes the transformer 210 and the rectifier 220 of FIG. 2, connected by the first trace 1340 and the second trace 1342 on different layers of a circuit board (e.g., stacked vertically). The system 1300 includes an alternating stack of coils 1350, near the first trace 1340 and the second trace 1342 on their respective layers. The winding directions of the coils in the alternating stack of coils 1350 alternate between layers in correspondence to the polarities of connections of the conductors on those layers (e.g., to the TRF+ and TRF− terminals of the transformer 210). The coils of the alternating stack of coils 1350 are connected in series between terminals of a measurement circuit (e.g., the measurement circuit 160) (not shown in FIG. 13).

The system 1300 includes a first trace 1340 on a layer of a circuit board. The first trace 1340 connects the first tap 216 to the rectifier 220. The system 1300 includes a second trace 1342 on an additional layer of the circuit board, stacked vertically with the first trace 1340. The second trace 1342 connects the second tap 218 to the rectifier 220. The second trace 1342 may be connected in series with the first trace 1340.

The system 1300 includes an alternating stack of coils 1350. For example, the alternating stack of coils 1350 may include a first coil including one or more turns of trace on the layer of the circuit board, adjacent to the first trace 1340. In some implementations, the first coil is positioned to inductively couple to the first trace 1340. For example, the alternating stack of coils 1350 may include a second coil including one or more turns of trace on the additional layer of the circuit board, stacked vertically with the first coil. The first coil and the second coil may have opposite winding directions. The second coil may be connected in series with the first coil between terminals of a measurement circuit (e.g., the measurement circuit 160) (not shown in FIG. 13). For example, the alternating stack of coils 1350 may include the alternating stack of coils 1420 of FIG. 14.

In some implementations (not shown in FIG. 13), a second alternating stack of coils may be positioned on an opposite side of the first trace 1340 and the second trace 1342 from the alternating stack of coils 1350. This second alternating stack of coils may have opposite winding directions with respect to the alternating stack of coils 1350 on each layer. The second alternating stack of coils may be connected in series with the alternating stack of coils 1350 between terminals of a measurement circuit (e.g., the measurement circuit 160) to capture more flux caused by current flowing in the first trace 1340 and the second trace 1342.

In some implementations (not shown in FIG. 13), conductors connected to the terminals of the transformer 210 may be interleaved on more layers (e.g., on 4 layers or 8 layers of a circuit board), so that current flows in each direction on multiple layers in parallel to reduce the current on individual layers. A larger stack of coils with winding directions alternating in correspondence to the interleaved stack of conductors may be used. For example, the alternating stack of coils may include the alternating stack of coils 1520 of FIG. 15.

Figure 14:
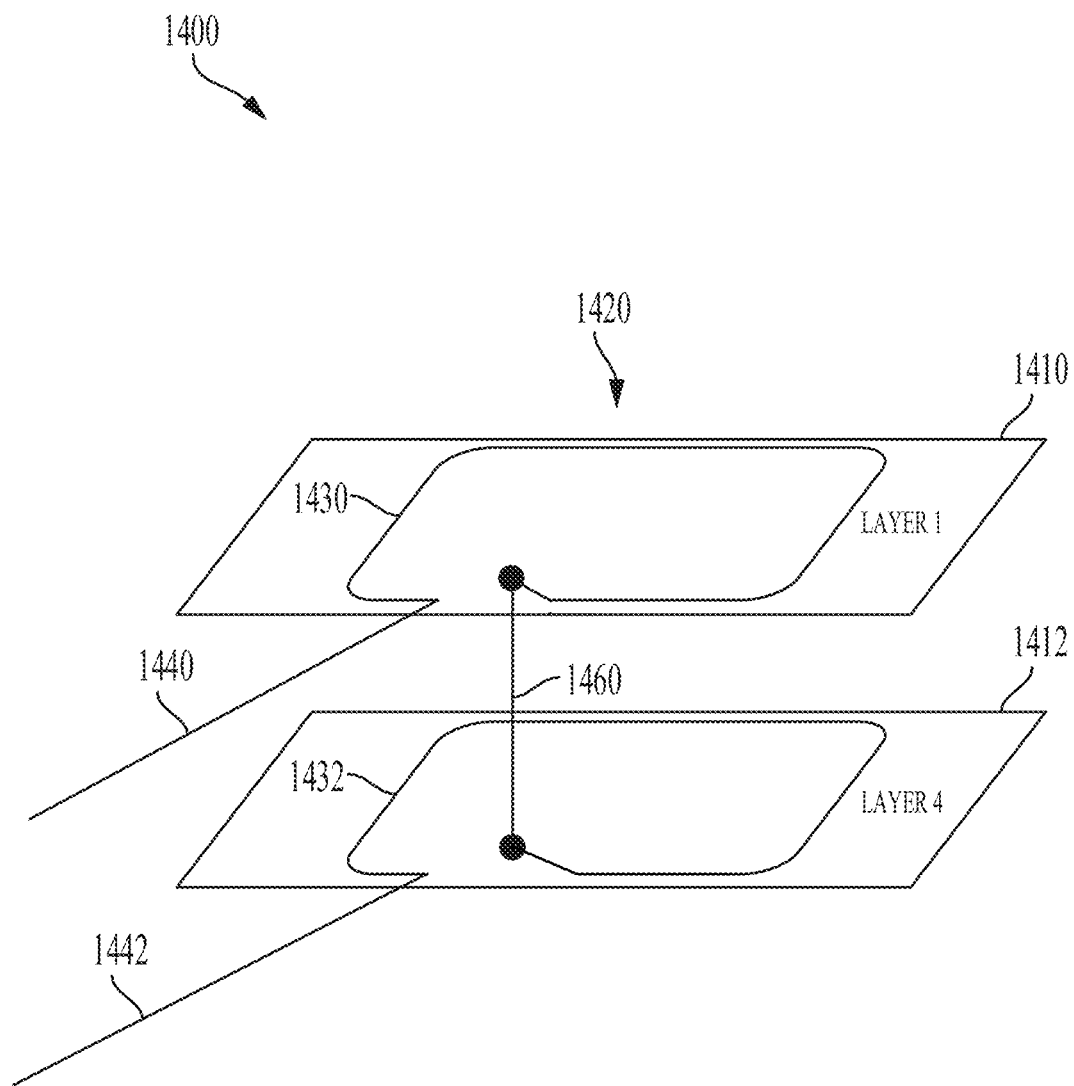
FIG. 14 is an illustration of an example of a system including a two-layer circuit board with a stack of coils in series with alternating winding directions for sensing current.

FIG. 14 is an illustration of an example of a system 1400 including a two-layer circuit board with a stack of coils in series with alternating winding directions for sensing current. The system 1400 includes a two-layer circuit board (e.g., a PCB) that includes a first layer 1410 (e.g., a top layer) and a second layer 1412 (e.g., a hidden layer or a bottom layer). The system 1400 includes an alternating stack of coils 1420 that each include one or more turns of trace (e.g., copper trace) on a respective layer of the circuit board. The alternating stack of coils 1420 is connected in series by a via 1460. The alternating stack of coils 1420 is connected to a first terminal 1440 on the first layer 1410. The alternating stack of coils 1420 is connected to a second terminal 1442 on the second layer 1412. For example, the coils (1430 and 1432) of the alternating stack of coils 1420 may have the alternating winding directions, with coils on adjacent layers having opposite winding directions. For example, the alternating stack of coils 1420 may be used to implement a current sensor of the system 100 of FIG. 1 or of the system 1300 of FIG. 13.

The system 1400 includes a first coil 1430 on the first layer 1410. Although not shown in FIG. 14, the first layer 1410 may also include a first trace (e.g., connected to a TRF+ terminal of a transformer) that is adjacent to and/or inductively coupled to the first coil 1430. This first trace may bear a time varying current that is measured using a current sensor that includes the alternating stack of coils 1420 (e.g., as described in relation to FIG. 1). The system includes a second coil 1432 including one or more turns of trace on an additional layer (i.e., the second layer 1412) of the circuit board, stacked vertically with the first coil 1430. Although not shown in FIG. 14, the second layer 1412 may also include a second trace (e.g., connected to a TRF− terminal of a transformer) that is adjacent to and/or inductively coupled to the second coil 1432. The second coil 1432 is connected in series with the first coil 1430 between terminals (e.g., the first terminal 1440 and the second terminal 1442) of a measurement circuit (e.g., the measurement circuit 160) (not shown in FIG. 14). The second coil 1432 is connected to the first coil 1430 by the via 1460.

Although not shown in FIG. 14, the coils (1430 and 1432) of the alternating stack of coils 1420 may include additional turns of trace (e.g., in a spiral arrangement) to capture more flux.

Figure 15:
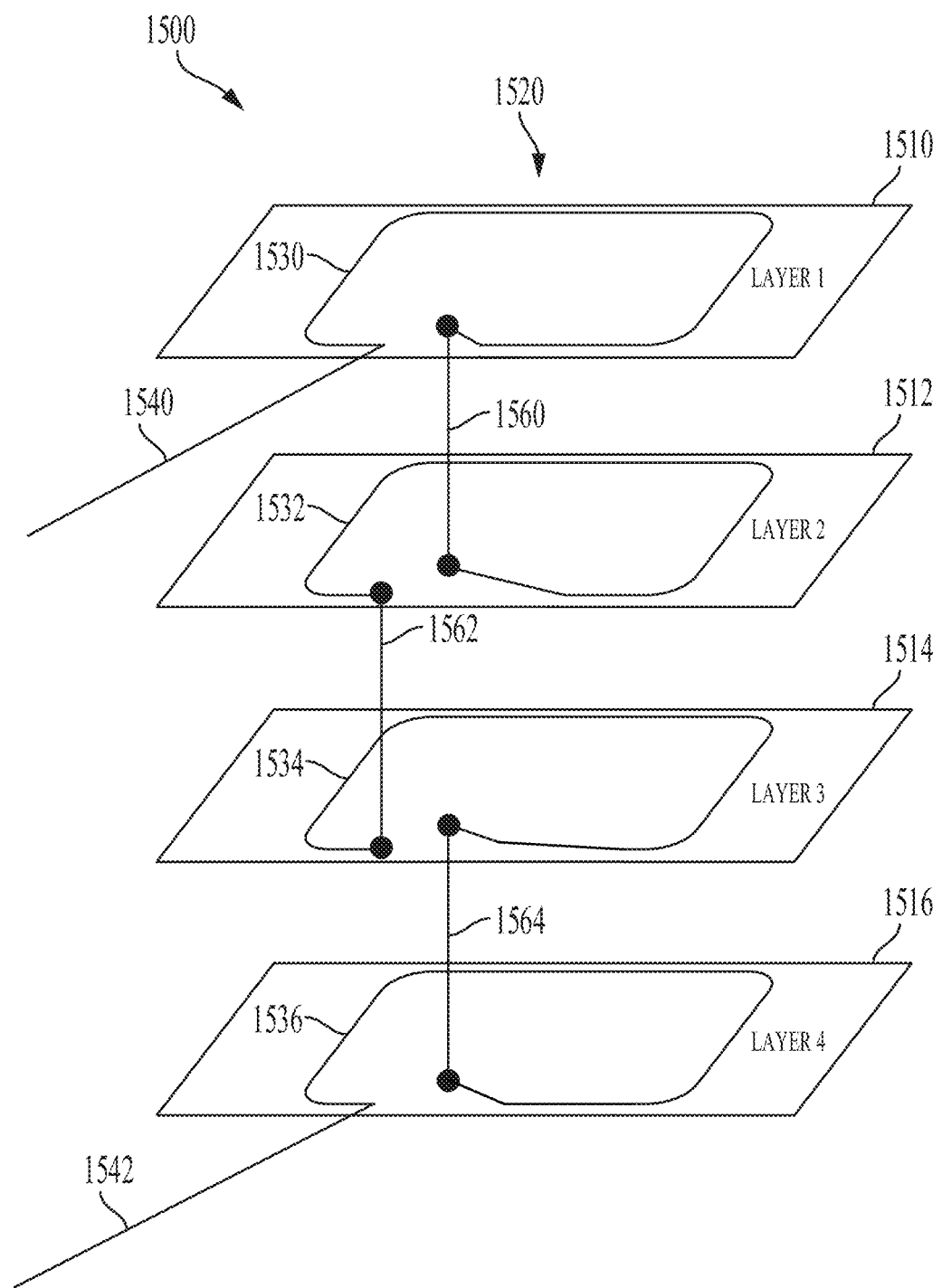
FIG. 15 is an illustration of an example of a system including a four-layer circuit board with a stack of coils in series with alternating winding directions for sensing current.

FIG. 15 is an illustration of an example of a system 1500 including a four-layer circuit board with a stack of coils in series with alternating winding directions for sensing current. The system 1500 includes a four-layer circuit board (e.g., a PCB) that includes a first layer 1510 (e.g., a top layer), a second layer 1512 (e.g., a hidden layer), a third layer 1514 (e.g., a hidden layer), and a fourth layer 1516 (e.g., a bottom layer). The system 1500 includes an alternating stack of coils 1520 that each include one or more turns of trace (e.g., copper trace) on a respective layer of the circuit board. The alternating stack of coils 1520 is connected in series by vias (1560, 1562, and 1564). The alternating stack of coils 1520 is connected to a first terminal 1540 on the first layer 1510. The alternating stack of coils 1520 is connected to a second terminal 1542 on the fourth layer 1516. For example, the coils (1530, 1532, 1534, and 1536) of the alternating stack of coils 1520 may have the alternating winding directions, with coils on adjacent layers having opposite winding directions. For example, the alternating stack of coils 1520 may be used to implement a current sensor of the system 100 of FIG. 1 or of the system 1300 of FIG. 13.

The system 1500 includes a first coil 1530 on the first layer 1510. Although not shown in FIG. 15, the first layer 1510 may also include a first trace (e.g., connected to a TRF+ terminal of a transformer) that is adjacent to and/or inductively coupled to the first coil 1530. This first trace may bear a time varying current that is measured using a current sensor that includes the alternating stack of coils 1520 (e.g., as described in relation to FIG. 1). The system includes a second coil 1532 including one or more turns of trace on an additional layer (i.e., the second layer 1512) of the circuit board, stacked vertically with the first coil 1530. Although not shown in FIG. 15, the second layer 1512 may also include a second trace (e.g., connected to a TRF− terminal of a transformer) that is adjacent to and/or inductively coupled to the second coil 1532. The second coil 1532 is connected in series with the first coil 1530 between terminals (e.g., the first terminal 1540 and the second terminal 1542) of a measurement circuit (e.g., the measurement circuit 160) (not shown in FIG. 15). The second coil 1532 is connected to the first coil 1530 by the via 1560. The system includes a third coil 1534 including one or more turns of trace on an additional layer (i.e., the third layer 1514) of the circuit board, stacked vertically with the first coil 1530. Although not shown in FIG. 15, the third layer 1514 may also include a third trace (e.g., connected to a TRF+ terminal of a transformer) that is adjacent to and/or inductively coupled to the third coil 1534. The third coil 1534 is connected in series with the first coil 1530 between terminals (e.g., the first terminal 1540 and the second terminal 1542) of a measurement circuit. The third coil 1534 is connected to the second coil 1532 by the via 1562. The system includes a fourth coil 1536 including one or more turns of trace on an additional layer (i.e., the fourth layer 1516) of the circuit board, stacked vertically with the first coil 1530. Although not shown in FIG. 15, the fourth layer 1516 may also include a fourth trace (e.g., connected to a TRF− terminal of a transformer) that is adjacent to and/or inductively coupled to the fourth coil 1536. The fourth coil 1536 is connected in series with the first coil 1530 between terminals (e.g., the first terminal 1540 and the second terminal 1542) of a measurement circuit. The fourth coil 1536 is connected to the third coil 1534 by the via 1564.

Although not shown in FIG. 15, the coils (1530, 1532, 1534, and 1536) of the alternating stack of coils 1520 may include additional turns of trace (e.g., in a spiral arrangement) to capture more flux.

Figure 16:
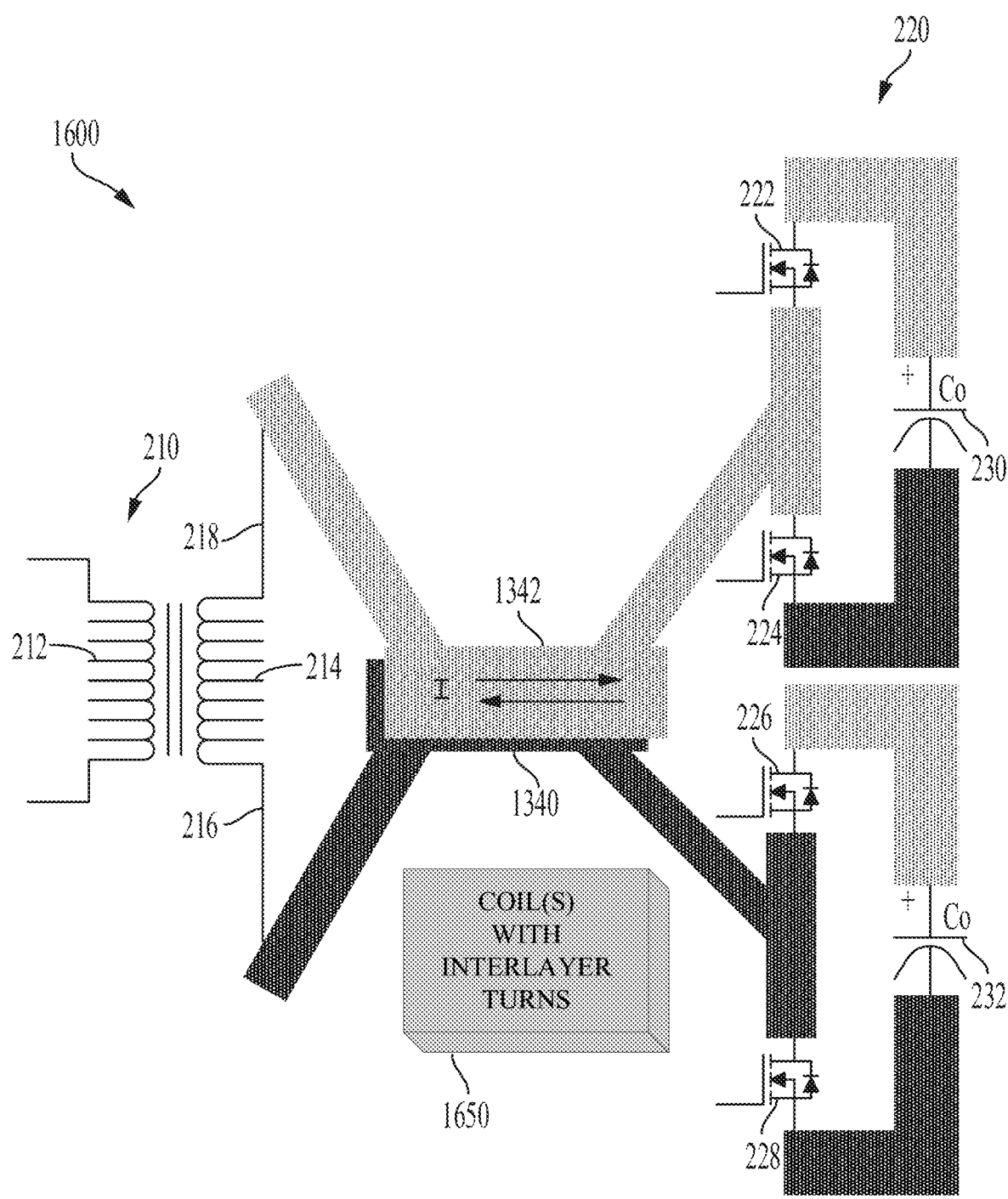
FIG. 16 is a circuit diagram of an example of a system including a power converter with a stack of interleaved conductors on multiple layers of a circuit board and one or more coils with interlayer turns for sensing current in the interleaved conductors.

FIG. 16 is a circuit diagram of an example of a system 1600 including a power converter with a stack of interleaved conductors on multiple layers of a circuit board and one or more coils with interlayer turns for sensing current in the interleaved conductors. The system 1600 includes the transformer 210 and the rectifier 220 of FIG. 2, connected by the first trace 1340 and the second trace 1342 on different layers of a circuit board (e.g., stacked vertically). The system 1300 includes one or more coils 1650 with interlayer turns, near the first trace 1340 and the second trace 1342 on their respective layers. The one or more coils 1650 are connected in series between terminals of a measurement circuit (e.g., the measurement circuit 160) (not shown in FIG. 16).

The system 1600 includes a first trace 1340 on a layer of a circuit board. The first trace 1340 connects the first tap 216 to the rectifier 220. The system 1600 includes a second trace 1342 on an additional layer of the circuit board, stacked vertically with the first trace 1340. The second trace 1342 connects the second tap 218 to the rectifier 220. The second trace 1342 may be connected in series with the first trace 1340.

The system 1600 includes one or more coils 1650 with interlayer turns, which may be stacked horizontally. An interlayer turn includes traces on multiple layers of a circuit board and conductors (e.g., vias or through-holes) connecting the layers. For example, a turn of coil may span two adjacent layers, being oriented approximately orthogonally to the plane of the circuit board, with the center of the turn being positioned between the two adjacent layers. In some implementations, interlayer turns of coil may be stacked horizontally within the circuit, from closer to farther from a pair if interleaved conductors, such as the first trace 1340 and the second trace 1342. The one or more coils 1650 with interlayer turns may be connected in series between terminals of a measurement circuit (e.g., the measurement circuit 160) (not shown in FIG. 16).

In some implementations (not shown in FIG. 16), conductors connected to the terminals of the transformer 210 may be interleaved on more layers (e.g., on 4 layers or 8 layers of a circuit board), so that current flows in each direction on multiple layers in parallel to reduce the current on individual layers. A larger vertical stack of coils with one or more coils with interlayer turns corresponding to respective pairs of conductors in the interleaved stack of conductors may be used. For example, the one or more coils 1650 with interlayer turns may include the coils 1720 with interlayer turns of FIG. 17. For example, the one or more coils 1650 with interlayer turns may include the coils 1820 with interlayer turns of FIG. 18 that include pairs of horizontally stacked coils.

Figure 17:
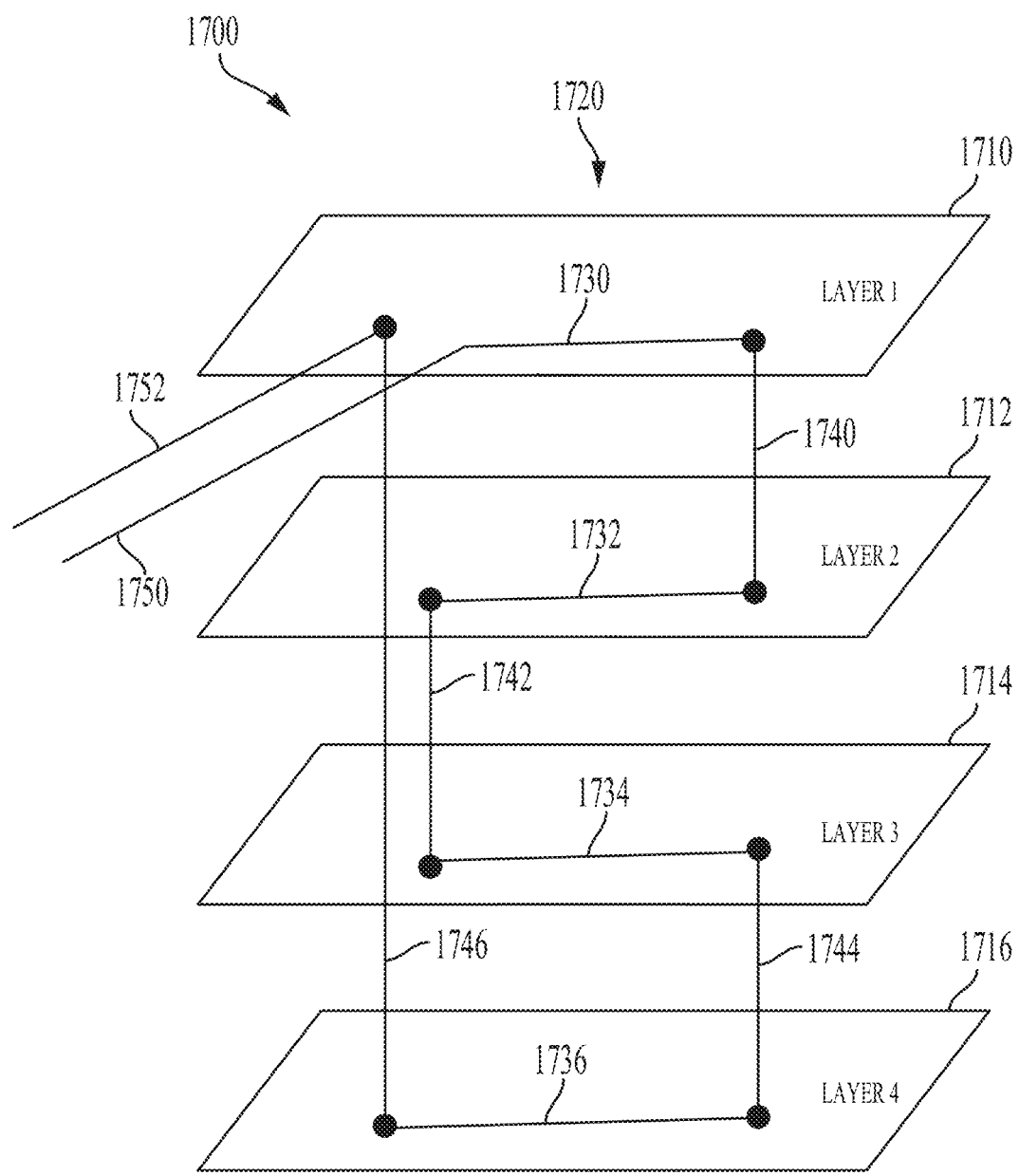
FIG. 17 is an illustration of an example of a system including a four-layer circuit board with two coils with interlayer turns for sensing current.

FIG. 17 is an illustration of an example of a system 1700 including a four-layer circuit board with two coils with interlayer turns for sensing current. The system 1700 includes a four-layer circuit board (e.g., a PCB) that includes a first layer 1710 (e.g., a top layer), a second layer 1712 (e.g., a hidden layer), a third layer 1714 (e.g., a hidden layer), and a fourth layer 1716 (e.g., a bottom layer). The system 1700 includes a vertical stack of coils 1720 with interlayer turns. For example, a first interlayer turn spans the first layer 1710 and the second layer 1712. The first interlayer turn includes a trace 1730 (e.g., a copper trace), a via 1740, a trace 1732, and the via 1746. For example, the first interlayer turn may be positioned adjacent to a pair of interleaved conductors (e.g., the first trace 1340 and the second trace 1342 of FIG. 16) (not shown in FIG. 17) on the first layer 1710 and the second layer 1712. For example, the first interlayer turn may be positioned to inductively couple to a pair of interleaved conductors. For example, a second interlayer turn spans the third layer 1714 and the fourth layer 1716. The second interlayer turn includes a trace 1734 (e.g., a copper trace), a via 1744, a trace 1736, and the via 1746. For example, the second interlayer turn may be positioned adjacent to a second pair of interleaved conductors (e.g., respectively connected to TRF+ terminal and a TRF− terminal of a transformer) (not shown in FIG. 17) on the third layer 1714 and the fourth layer 1716. For example, the second interlayer turn may be positioned to inductively couple to the second pair of interleaved conductors. The vertical stack of coils 1720 is connected by a via 1742 and the via 1746. The vertical stack of coils 1720 is connected to a first terminal 1750 and a second terminal 1752 on the first layer 1710. For example, the vertical stack of coils 1720 may be used to implement a current sensor of the system 100 of FIG. 1 or of the system 1600 of FIG. 16. The vertical stack of coils 1720 is connected between terminals (e.g., the first terminal 1750 and the second terminal 1752) of a measurement circuit (e.g., the measurement circuit 160) (not shown in FIG. 17).

Figure 18:
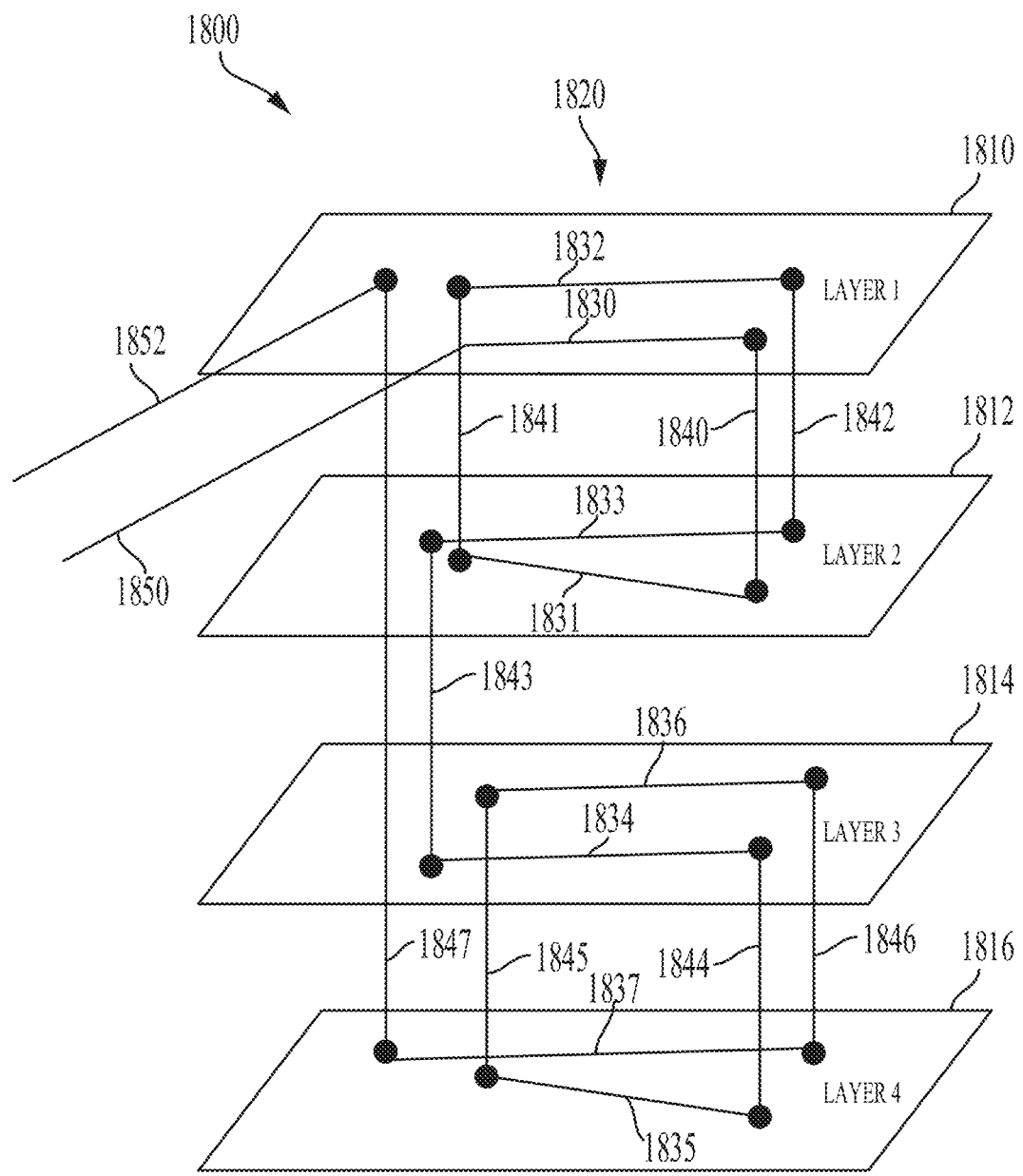
FIG. 18 is an illustration of an example of a system including a four-layer circuit board with two horizontal stacks of coils with interlayer turns for sensing current.

FIG. 18 is an illustration of an example of a system 1800 including a four-layer circuit board with two horizontal stacks of coils with interlayer turns for sensing current. The system 1800 includes a four-layer circuit board (e.g., a PCB) that includes a first layer 1810 (e.g., a top layer), a second layer 1812 (e.g., a hidden layer), a third layer 1814 (e.g., a hidden layer), and a fourth layer 1816 (e.g., a bottom layer). The system 1800 includes a vertical stack of coils 1820 with interlayer turns, including pairs of horizontally stacked interlayer turns. For example, a first interlayer turn spans the first layer 1810 and the second layer 1812. The first interlayer turn includes a trace 1830 (e.g., a copper trace), a via 1840, a trace 1831, and a via 1841. For example, the first interlayer turn may be positioned adjacent to a pair of interleaved conductors (e.g., the first trace 1340 and the second trace 1342 of FIG. 16) (not shown in FIG. 18) on the first layer 1810 and the second layer 1812. For example, the first interlayer turn may be positioned to inductively couple to a pair of interleaved conductors. For example, a second interlayer turn spans the first layer 1810 and the second layer 1812. The second interlayer turn includes a trace 1832 (e.g., a copper trace), a via 1842, a trace 1832, and a via 1847. For example, the second interlayer turn may be positioned to inductively couple to a pair of interleaved conductors (e.g., the first trace 1340 and the second trace 1342 of FIG. 16) (not shown in FIG. 18) on the first layer 1810 and the second layer 1812. The second interlayer turn is horizontally stacked with the first interlayer turn, positioned slightly farther from the pair of interleaved conductors. For example, a third interlayer turn spans the third layer 1814 and the fourth layer 1816. The third interlayer turn includes a trace 1834 (e.g., a copper trace), a via 1844, a trace 1835, and a via 1845. For example, the third interlayer turn may be positioned adjacent to a pair of interleaved conductors (not shown in FIG. 18) on the third layer 1814 and the fourth layer 1816. For example, the third interlayer turn may be positioned to inductively couple to a pair of interleaved conductors. For example, a fourth interlayer turn spans the third layer 1814 and the fourth layer 1816. The fourth interlayer turn includes a trace 1836 (e.g., a copper trace), a via 1846, a trace 1837, and the via 1847. For example, the fourth interlayer turn may be positioned to inductively couple to a pair of interleaved conductors (not shown in FIG. 18) on the third layer 1814 and the fourth layer 1816. The fourth interlayer turn is horizontally stacked with the third interlayer turn, positioned slightly farther from the pair of interleaved conductors. The vertical stack of coils 1820 is connected by via 1843 and the via 1847. The vertical stack of coils 1820 is connected to a first terminal 1850 and a second terminal 1852 on the first layer 1810. For example, the vertical stack of coils 1820 may be used to implement a current sensor of the system 100 of FIG. 1 or of the system 1600 of FIG. 16. The vertical stack of coils 1820 is connected between terminals (e.g., the first terminal 1850 and the second terminal 1852) of a measurement circuit (e.g., the measurement circuit 160) (not shown in FIG. 18).

As described above, one aspect of the present technology is the gathering and use of data available from various sources. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to adjust power consumption profiles for an associated device. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of location aware services, the present technology can be configured to allow users to select to "opt in" or "opt out" of participation in the collection of personal information data during registration for services or anytime thereafter. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, power consumption can be adjusted based on non-personal information data or a bare minimum amount of personal information, such as the content being requested by the device associated with a user, other non-personal information available to the vehicle or associated computing device, or publicly available information.

What is claimed is:

1. A power converter comprising:
   a transformer including a winding that connects a first tap and a second tap;
   a circuit board;
   a first trace on a layer of the circuit board, wherein the first trace connects the first tap to a rectifier;
   a first coil including one or more turns of trace on the layer of the circuit board, adjacent to the first trace, wherein the first coil is isolated from the transformer;
   a second coil including one or more turns of trace on an additional layer of the circuit board, stacked vertically with the first coil; and
   a measurement circuit configured to estimate current flowing in the first trace based on voltage across the first coil, wherein the second coil is connected in series with the first coil between terminals of the measurement circuit to capture more flux and induce more voltage.

2. The power converter of claim 1, wherein the first coil includes two or more turns arranged in a spiral.

3. The power converter of claim 1, wherein an edge of the first coil is within one millimeter of an edge of the first trace.

4. The power converter of claim 1, further comprising:
   a third coil including one or more turns of trace on the layer of the circuit board, adjacent to the first trace, on an opposite side of the first trace from the first coil, wherein the third coil is connected in series with the first coil between terminals of the measurement circuit.

5. The power converter of claim 4, wherein the first coil and the third coil have opposite winding directions.

6. The power converter of claim 1, comprising:
   a second trace on the layer of the circuit board, wherein the second trace connects the second tap to the rectifier; and
   a third coil including one or more turns of trace on the layer of the circuit board, adjacent to the second trace, wherein the third coil is connected in series with the first coil between terminals of the measurement circuit.

7. The power converter of claim 1, comprising:
   a third coil including one or more turns of trace on the layer of the circuit board, adjacent to the first trace, on a same side of the first trace as the first coil, wherein the third coil is connected in series with the first coil between terminals of the measurement circuit.

8. The power converter of claim 1, comprising:
   a second trace on the layer of the circuit board, wherein the second trace connects the second tap to the rectifier;
   a third coil including one or more turns of trace on the layer of the circuit board, adjacent to the second trace;
   a fourth coil including one or more turns of trace on the layer of the circuit board, adjacent to the first trace, on an opposite side of the first trace from the first coil; and
   a fifth coil including one or more turns of trace on the layer of the circuit board, adjacent to the second trace, on an opposite side of the second trace from the third coil, wherein the fifth coil is connected in series with the fourth coil, the third coil, and the first coil between terminals of the measurement circuit.

9. The power converter of claim 1, comprising:
   a second trace on the layer of the circuit board, wherein the second trace connects the second tap to the rectifier, wherein the first coil is adjacent to the second trace.

10. The power converter of claim 1, comprising:
    a second trace on the layer of the circuit board, wherein the second trace connects the second tap to the rectifier, wherein the first coil is adjacent to the second trace;
    a third coil including one or more turns of trace on the layer of the circuit board, adjacent to the first trace, on an opposite side of the first trace from the first coil; and
    a fourth coil including one or more turns of trace on the layer of the circuit board, adjacent to the second trace, on an opposite side of the second trace from the first coil, wherein the fourth coil is connected in series with the third coil and the first coil between terminals of the measurement circuit.

11. The power converter of claim 1, comprising:
    a second trace on an additional layer of the circuit board, stacked vertically with the first trace, wherein the second trace connects the second tap to the rectifier; and
    a third coil including one or more turns of trace on the additional layer of the circuit board, stacked vertically with the first coil, wherein the first coil and the third coil have opposite winding directions, and wherein the third coil is connected in series with the first coil between terminals of the measurement circuit.

12. The power converter of claim 1, comprising:
    a comparator circuit configured to detect, based on an estimate of current from the measurement circuit, whether current flowing in the first trace is outside of a range, and, responsive to detection of current outside of the range, generate a signal to cause a circuit connected to the transformer to be opened to stop current from flowing in the transformer.

13. The power converter of claim 1, comprising:
    a peak detection circuit configured to generate an estimate of peak current in the first trace based on estimates of current from the measurement circuit; and
    a valley detection circuit configured to generate an estimate of valley current in the first trace based on estimates of current from the measurement circuit.

14. The power converter of claim 13, comprising a processor configured to:
  receive the estimate of peak current from the peak detection circuit;
  receive the estimate of valley current from the valley detection circuit; and
  determine a prediction of a current in the rectifier based on the estimate of peak current and the estimate of valley current.

15. The power converter of claim 1, wherein the measurement circuit comprises:
  an integrator circuit configured to estimate current flowing in the first trace based on integration over time of voltage across the first coil.

16. A system comprising:
  a transformer including a winding that connects a first tap and a second tap;
  a circuit board;
  a first trace on a layer of the circuit board, wherein the first trace connects [he] the first tap to a rectifier;
  a first coil including one or more turns of trace on the layer of the circuit board, positioned to inductively couple to the first trace, wherein the first coil is isolated from the transformer;
  a second coil including one or more turns of trace on an additional layer of the circuit board, stacked vertically with the first coil; and
  a measurement circuit, configured to estimate current flowing in the first trace based on voltage across the first coil, wherein the second coil is connected in series with the first coil between terminals of the measurement circuit.

17. The system of claim 16, comprising:
  a comparator circuit configured to detect, based on an estimate of current from the measurement circuit, whether current flowing in the first trace is outside of a range, and, responsive to detection of current outside of the range, generate a signal to cause a circuit connected to the transformer to be opened to stop current from flowing in the transformer.

18. The power converter of claim 16, comprising:
  a third coil including one or more turns of trace on the layer of the circuit board, adjacent to the first trace, on a same side of the first trace as the first coil, wherein the third coil is connected in series with the first coil between terminals of the measurement circuit.

19. A system comprising:
  a transformer including a secondary winding that connects a first tap and a second tap;
  a first length of conductor that connects the first tap to a rectifier;
  a coil including two or more turns of conductor in a spiral arrangement that is coplanar with the first length of conductor, and adjacent to the first length of conductor, wherein the coil is isolated from the transformer; and
  a measurement circuit configured to estimate current flowing in the first length of conductor based on voltage across the coil.

20. The system of claim 19, comprising:
  a comparator circuit configured to detect, based on an estimate of current from the measurement circuit, whether current flowing in the first length of conductor is outside of a range, and, responsive to detection of current outside of the range, generate a signal to cause a circuit connected to the transformer to be opened to stop current from flowing in the transformer.

* * * * *

UNITED STATES PATENT AND TRADEMARK OFFICE
CERTIFICATE OF CORRECTION

| | |
|---|---|
| PATENT NO. | : 12,126,264 B1 |
| APPLICATION NO. | : 16/720749 |
| DATED | : October 22, 2024 |
| INVENTOR(S) | : Brandon Pierquet et al. |

It is certified that error appears in the above-identified patent and that said Letters Patent is hereby corrected as shown below:

In the Claims

At Column 27, Claim number 16, Line number 20, "connects [he] the first" should be --connects the first--.

Signed and Sealed this
Third Day of December, 2024

Katherine Kelly Vidal
*Director of the United States Patent and Trademark Office*